United States Patent
Graumann

(10) Patent No.: US 11,843,393 B2
(45) Date of Patent: Dec. 12, 2023

(54) METHOD AND APPARATUS FOR DECODING WITH TRAPPED-BLOCK MANAGEMENT

(71) Applicant: Microchip Technology Inc., Chandler, AZ (US)

(72) Inventor: Peter John Waldemar Graumann, Calgary (CA)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 17/952,240

(22) Filed: Sep. 24, 2022

(65) Prior Publication Data

US 2023/0094363 A1    Mar. 30, 2023

Related U.S. Application Data

(60) Provisional application No. 63/249,556, filed on Sep. 28, 2021.

(51) Int. Cl.
*H03M 13/11* (2006.01)
*H03M 13/00* (2006.01)

(52) U.S. Cl.
CPC ...... *H03M 13/1111* (2013.01); *H03M 13/611* (2013.01)

(58) Field of Classification Search
None
See application file for complete search history.

(56) References Cited

U.S. PATENT DOCUMENTS 6,567,313 B2    5/2003    Tanaka et al.
6,704,871 B1    3/2004    Kaplan et al.
(Continued)

FOREIGN PATENT DOCUMENTS

WO    2009156883 A1    12/2009
WO    2020117348 A3    12/2020

OTHER PUBLICATIONS

J. Mu et al., "The impact of faulty memory bit cells on the decoding of spatially-coupled LDPC codes," 2015 49th Asilomar Conference on Signals, Systems and Computers, Pacific Grove, CA, USA, 2015, pp. 1627-1631, doi: 10.1109/ACSSC.2015.7421423. (Year: 2015).*

(Continued)

*Primary Examiner* — Daniel F. McMahon
(74) *Attorney, Agent, or Firm* — GLASS AND ASSOCIATES; Kenneth Glass

(57) ABSTRACT

A method and apparatus for decoding in which a first failed decode operation is performed on raw bit values of a FEC block by a LDPC decoder. When the FEC block is determined to be a trapped block an updated LLR map is generated; the updated LLR map and either the raw bit values of the FEC block or a failed-decode-output-block from a previous failed decode operation on the trapped block are provided to the LDPC decoder; a decode operation of the LDPC decoder is performed using the updated LLR map on the bit values of the FEC block or the failed-decode-output-block from the previous failed decode operation; and the generating, the providing and the performing are repeated until the decode operation is successful or until a predetermined number of trapped-block-decoding iterations have been performed. When the decode operation is successful in decoding the FEC block the codeword is output.

19 Claims, 16 Drawing Sheets

(56) References Cited

U.S. PATENT DOCUMENTS

| | | |
|---|---|---|
| 7,139,312 B2 | 11/2006 | Graumann |
| 7,415,584 B2 | 8/2008 | Gibb et al. |
| 7,428,564 B2 | 9/2008 | Gibb et al. |
| 7,529,215 B2 | 5/2009 | Osterling et al. |
| 7,650,480 B2 | 1/2010 | Jiang |
| 7,916,641 B2 | 3/2011 | Bourlas et al. |
| 7,930,623 B2 | 4/2011 | Pisek et al. |
| 7,961,593 B2 | 6/2011 | Porat et al. |
| 8,020,070 B2 | 9/2011 | Langner et al. |
| 8,196,016 B1 | 6/2012 | Langner et al. |
| 8,196,024 B2 | 6/2012 | Asirvatham et al. |
| 8,386,870 B2 | 2/2013 | Graumann |
| 8,429,325 B1 | 4/2013 | Onufryk et al. |
| 8,448,039 B2 | 5/2013 | Gunnam |
| 8,504,895 B2 | 8/2013 | Sharon et al. |
| 8,509,073 B2 | 8/2013 | Bourlas et al. |
| 8,594,135 B2 | 11/2013 | Porat et al. |
| 8,621,318 B1 | 12/2013 | Micheloni et al. |
| 8,625,498 B2 | 1/2014 | Bourlas et al. |
| 8,631,309 B2 | 1/2014 | Graumann et al. |
| 8,639,998 B2 | 1/2014 | Graumann |
| 8,656,257 B1 | 2/2014 | Micheloni et al. |
| 8,665,648 B2 | 3/2014 | Mun et al. |
| 8,679,845 B2 | 3/2014 | Maizels et al. |
| 8,689,074 B1 * | 4/2014 | Tai ................ H03M 13/658 714/24 |
| 8,689,084 B1 | 4/2014 | Tai |
| 8,694,849 B1 | 4/2014 | Micheloni et al. |
| 8,694,855 B1 | 4/2014 | Micheloni et al. |
| 8,700,976 B2 | 4/2014 | Gunnam et al. |
| 8,707,122 B1 | 4/2014 | Micheloni et al. |
| 8,769,380 B1 | 7/2014 | Burd et al. |
| 8,806,307 B2 | 8/2014 | Alrod et al. |
| 8,892,976 B2 | 11/2014 | Graumann |
| 8,898,537 B2 | 11/2014 | Gross et al. |
| 8,938,037 B1 | 1/2015 | Fard et al. |
| 8,966,335 B2 | 2/2015 | Lunelli et al. |
| 8,971,112 B2 | 3/2015 | Crippa et al. |
| 8,971,396 B1 | 3/2015 | Bates et al. |
| 8,984,376 B1 * | 3/2015 | Norrie ............... H03M 13/114 714/801 |
| 8,990,661 B1 | 3/2015 | Micheloni et al. |
| 9,009,565 B1 | 4/2015 | Northcott et al. |
| 9,026,867 B1 | 5/2015 | Northcott et al. |
| 9,053,012 B1 | 6/2015 | Northcott et al. |
| 9,081,701 B1 | 7/2015 | Northcott et al. |
| 9,092,353 B1 | 7/2015 | Micheloni et al. |
| 9,128,858 B1 | 9/2015 | Micheloni et al. |
| 9,166,623 B1 | 10/2015 | Bates et al. |
| 9,170,876 B1 | 10/2015 | Bates et al. |
| 9,208,018 B1 | 12/2015 | Northcott et al. |
| 9,235,467 B2 | 1/2016 | Micheloni et al. |
| 9,251,909 B1 | 2/2016 | Camp et al. |
| 9,268,531 B1 | 2/2016 | Woo et al. |
| 9,270,296 B1 | 2/2016 | Anaraki et al. |
| 9,292,428 B2 | 3/2016 | Kanamori et al. |
| 9,305,661 B2 | 4/2016 | Micheloni et al. |
| 9,325,347 B1 | 4/2016 | Graumann et al. |
| 9,397,701 B1 | 7/2016 | Micheloni et al. |
| 9,417,804 B2 | 8/2016 | Micheloni et al. |
| 9,432,053 B1 | 8/2016 | Graumann et al. |
| 9,444,655 B2 | 9/2016 | Sverdlov et al. |
| 9,448,881 B1 | 9/2016 | Micheloni et al. |
| 9,450,610 B1 | 9/2016 | Micheloni et al. |
| 9,454,414 B2 | 9/2016 | Micheloni et al. |
| 9,467,172 B1 | 10/2016 | Graumann et al. |
| 9,473,175 B1 | 10/2016 | Graumann et al. |
| 9,479,297 B2 | 10/2016 | Graumann |
| 9,524,210 B1 | 12/2016 | Asnaashari |
| 9,564,921 B1 | 2/2017 | Graumann et al. |
| 9,564,922 B1 * | 2/2017 | Graumann ......... H03M 13/1142 |
| 9,590,656 B2 | 3/2017 | Micheloni et al. |
| 9,602,133 B1 | 3/2017 | Graumann et al. |
| 9,742,439 B2 | 8/2017 | Graumann |
| 9,747,200 B1 | 8/2017 | Micheloni |
| 9,793,924 B1 | 10/2017 | Graumann et al. |
| 9,799,405 B1 | 10/2017 | Micheloni et al. |
| 9,813,080 B1 | 11/2017 | Micheloni et al. |
| 9,860,089 B2 | 1/2018 | Lee et al. |
| 9,886,214 B2 | 2/2018 | Micheloni et al. |
| 9,892,794 B2 | 2/2018 | Micheloni et al. |
| 9,899,092 B2 | 2/2018 | Micheloni |
| 10,152,273 B2 | 12/2018 | Micheloni et al. |
| 10,157,677 B2 | 12/2018 | Marelli et al. |
| 10,216,422 B2 | 2/2019 | Kim et al. |
| 10,230,396 B1 | 3/2019 | Micheloni et al. |
| 10,230,552 B1 | 3/2019 | Graumann |
| 10,236,915 B2 | 3/2019 | Graumann et al. |
| 10,283,215 B2 | 5/2019 | Marelli et al. |
| 10,291,263 B2 | 5/2019 | Marelli et al. |
| 10,332,613 B1 | 6/2019 | Micheloni et al. |
| 10,490,288 B1 | 11/2019 | Wang et al. |
| 10,505,707 B2 | 12/2019 | Graumann |
| 10,700,713 B2 | 6/2020 | Graumann et al. |
| 10,715,307 B1 | 7/2020 | Jin |
| 10,861,562 B1 | 12/2020 | Xiong et al. |
| 10,972,249 B1 | 4/2021 | Graumann |
| 10,977,118 B2 | 4/2021 | Niu et al. |
| 11,086,716 B2 | 8/2021 | Graumann |
| 11,165,443 B2 | 11/2021 | Graumann |
| 11,398,291 B2 | 7/2022 | Zuolo et al. |
| 11,514,994 B1 | 11/2022 | Zuo |
| 2002/0144210 A1 | 10/2002 | Borkenhagen et al. |
| 2003/0219083 A1 | 11/2003 | Graumann |
| 2005/0015420 A1 | 1/2005 | Gibb et al. |
| 2005/0114420 A1 | 5/2005 | Gibb et al. |
| 2005/0114421 A1 | 5/2005 | Gibb et al. |
| 2006/0106743 A1 | 5/2006 | Horvitz |
| 2006/0282603 A1 | 12/2006 | Onufryk et al. |
| 2007/0076873 A1 | 4/2007 | Yamamoto et al. |
| 2008/0002567 A1 | 1/2008 | Bourlas et al. |
| 2008/0176577 A1 | 7/2008 | Bourlas et al. |
| 2008/0288569 A1 | 11/2008 | Gibb et al. |
| 2009/0190465 A1 | 7/2009 | Porat et al. |
| 2009/0319860 A1 | 12/2009 | Sharon et al. |
| 2009/0327820 A1 | 12/2009 | Asirvatham et al. |
| 2010/0037112 A1 | 2/2010 | Graumann |
| 2010/0238993 A1 | 9/2010 | Huang et al. |
| 2010/0329322 A1 | 12/2010 | Mobin et al. |
| 2011/0176446 A1 | 7/2011 | Bourlas et al. |
| 2011/0231731 A1 | 9/2011 | Gross et al. |
| 2011/0242964 A1 | 10/2011 | Porat et al. |
| 2011/0255453 A1 | 10/2011 | Roh et al. |
| 2011/0311002 A1 | 12/2011 | Li et al. |
| 2012/0166714 A1 | 6/2012 | Mun et al. |
| 2012/0287719 A1 | 11/2012 | Mun et al. |
| 2012/0300873 A1 | 11/2012 | Graumann et al. |
| 2013/0243070 A1 | 9/2013 | Ito et al. |
| 2013/0254628 A1 | 9/2013 | Kim et al. |
| 2013/0343495 A1 * | 12/2013 | Han ............... H03M 13/6331 375/350 |
| 2014/0019825 A1 | 1/2014 | Aliseychik et al. |
| 2014/0040697 A1 | 2/2014 | Loewenstein |
| 2014/0146605 A1 | 5/2014 | Yang |
| 2014/0237313 A1 | 8/2014 | Wang et al. |
| 2014/0281800 A1 | 9/2014 | Micheloni et al. |
| 2014/0281823 A1 | 9/2014 | Micheloni et al. |
| 2014/0310534 A1 | 10/2014 | Gurgi et al. |
| 2015/0026536 A1 | 1/2015 | Hubris et al. |
| 2015/0033037 A1 | 1/2015 | Lidman et al. |
| 2015/0049548 A1 | 2/2015 | Park et al. |
| 2015/0067446 A1 | 3/2015 | Yen et al. |
| 2015/0074481 A1 | 3/2015 | Graumann |
| 2015/0100860 A1 | 4/2015 | Lee et al. |
| 2016/0072527 A1 | 3/2016 | Suzuki et al. |
| 2016/0127155 A1 | 5/2016 | Johnson et al. |
| 2016/0247581 A1 | 8/2016 | Suzuki et al. |
| 2016/0266791 A1 | 9/2016 | Lin et al. |
| 2016/0371014 A1 | 12/2016 | Roberts |
| 2017/0005841 A1 | 1/2017 | Komori et al. |
| 2017/0133107 A1 | 5/2017 | Ryan et al. |
| 2017/0149446 A1 | 5/2017 | Tao et al. |
| 2017/0213597 A1 | 7/2017 | Micheloni |
| 2017/0288699 A1 | 10/2017 | Yang et al. |

(56) References Cited

U.S. PATENT DOCUMENTS

| | | |
|---|---|---|
| 2018/0005670 A1 | 1/2018 | Lee et al. |
| 2018/0032282 A1 | 2/2018 | Hahn et al. |
| 2018/0033490 A1 | 2/2018 | Marelli et al. |
| 2018/0034483 A1 | 2/2018 | Graumann et al. |
| 2018/0046541 A1 | 2/2018 | Niu et al. |
| 2018/0167240 A1 | 6/2018 | Li et al. |
| 2018/0314586 A1 | 11/2018 | Artieri et al. |
| 2019/0004734 A1 | 1/2019 | Kirshenbaum et al. |
| 2019/0044539 A1 | 2/2019 | Graumann et al. |
| 2019/0073139 A1 | 3/2019 | Kim et al. |
| 2019/0087119 A1 | 3/2019 | Oh et al. |
| 2019/0095794 A1 | 3/2019 | López et al. |
| 2019/0149168 A1 | 5/2019 | Chang et al. |
| 2019/0149169 A1 | 5/2019 | Chang et al. |
| 2019/0207740 A1 | 7/2019 | Graumann |
| 2019/0317901 A1 | 10/2019 | Kachare et al. |
| 2020/0004455 A1 | 1/2020 | Williams et al. |
| 2020/0066361 A1 | 2/2020 | Ioannou et al. |
| 2020/0074269 A1 | 3/2020 | Trygg et al. |
| 2020/0106461 A1 | 4/2020 | Graumann |
| 2020/0125955 A1 | 4/2020 | Klinger et al. |
| 2020/0151539 A1 | 5/2020 | Oh et al. |
| 2020/0183826 A1 | 6/2020 | Beaudoin et al. |
| 2020/0185027 A1 | 6/2020 | Rom et al. |
| 2020/0210831 A1 | 7/2020 | Zhang et al. |
| 2021/0028795 A1 | 1/2021 | Graumann |
| 2021/0109673 A1 | 4/2021 | Kim et al. |
| 2021/0192333 A1 | 6/2021 | Thiruvengadam et al. |
| 2022/0027083 A1 | 1/2022 | Zuolo et al. |
| 2022/0050632 A1 | 2/2022 | Hong et al. |
| 2022/0051730 A1 | 2/2022 | Choi et al. |
| 2022/0052710 A1 | 2/2022 | Graumann |
| 2022/0058488 A1 | 2/2022 | Zuolo et al. |
| 2022/0116056 A1* | 4/2022 | Kaynak ............ H03M 13/3715 |
| 2022/0165348 A1 | 5/2022 | Zuolo et al. |
| 2022/0188604 A1 | 6/2022 | Zuolo et al. |
| 2022/0270698 A1 | 8/2022 | Zuolo et al. |
| 2022/0329262 A1* | 10/2022 | Liu .................... H03M 13/1111 |
| 2022/0342582 A1 | 10/2022 | Graumann |
| 2022/0365845 A1 | 11/2022 | Buch et al. |
| 2022/0374169 A1 | 11/2022 | Zuolo et al. |
| 2022/0375532 A1 | 11/2022 | Zuolo et al. |
| 2022/0382629 A1 | 12/2022 | Graumann |
| 2022/0383970 A1 | 12/2022 | Zuolo et al. |
| 2022/0416812 A1* | 12/2022 | Wu .................... H03M 13/6577 |
| 2023/0087247 A1* | 3/2023 | Li ........................ H03M 13/116 |
| | | 714/752 |

OTHER PUBLICATIONS

Yu Cai et al, "Errors in Flash-Memory-Based Solid-State Drives: Analysis, Mitigation, and Recovery" 11 , arxiv. org, Cornell University Library, 201 Olin Library Cornell University Ithaca, NY 14853, Nov. 28, 2017.

PCT/US2022/044641, "International Search Report and Written Opinion," European Patent Office, dated Dec. 21, 2022.

* cited by examiner

First Failed Decode 20a

First Trapped-Block-Decoding Iteration 40a

Second Trapped-Block-Decoding Iteration 40b

Third Trapped-Block-Decoding Iteration 40c

Nth Trapped-Block-Decoding Iteration 40d

| | Raw Bit | Stochastic Bit | Weak Bit | Input LLR |
|---|---|---|---|---|
| 70a | 0 | 0 | 0 | +S |
| 70b | 0 | 0 | 1 | +W |
| 70c | 0 | 1 | 0 | +(S+Sd) |
| 70d | 0 | 1 | 1 | +(W+Wd) |
| 70e | 1 | 0 | 0 | -S |
| 70f | 1 | 0 | 1 | -W |
| 70g | 1 | 1 | 0 | -(S+Sd) |
| 70h | 1 | 1 | 1 | -(W+Wd) |

METHOD AND APPARATUS FOR DECODING WITH TRAPPED-BLOCK MANAGEMENT

CROSS-REFERENCE TO RELATED APPLICATIONS

The present application claims priority to U.S. Provisional Patent Application Ser. No. 63/249,556 filed on Sep. 28, 2021, the contents of which are incorporated by reference herein in their entirety.

BACKGROUND OF THE INVENTION

Error correction solutions are subject to error-floors where further reductions in input error rate no longer lead to significant error correction performance increases. The Frame Error Rate (FER) where the actual performance for the particular decoding process begins to significantly diverge from the theoretical performance for the particular decoding process defines the error floor performance. The expected performance for the particular decoding process is sometimes referred to as the "waterfall" for the decode process, and it extends below the error floor.

Floor-breaker methods employed in previous devices typically change the low-density parity check (LDPC) decoding algorithm itself. However, these methods rely on recycling challenging blocks through a standard LDPC decoder that itself has no capacity for dealing with error floor conditions. Furthermore, FER and error floor are inversely related so that improving one of these factors leads to degradation in the other factor.

The nature of error floors is that there are few bit-errors remaining in a forward error correction (FEC) block as the performance curve (e.g., a curve of frame error vs bit error rate (BER)) approaches the error floor, but the errors are located in such a manner as to render standard LDPC algorithms ineffective in correcting the errored bits. The conditions that produce these decode failures near where the performance curve approaches the error floor are generally referred to as "trapping sets." The trapping sets that result as the performance curve approaches the error floor exhibit decode failures even though the number of failing check nodes in the block that failed to decode is very low. The syndrome for a block that fails to decode indicates the number of failing check nodes for that particular decode operation. Thus, these trapping sets produce decode failures even though the syndrome for the block is very low (e.g., less than 20 failing check nodes).

Accordingly, there is a need for a method and apparatus that will reduce the number of errors resulting from the trapping sets so as to extend the performance curve below the error floor for a particular LDPC decoding process.

SUMMARY OF THE INVENTION

A decode circuit for a memory controller includes an input to receive raw bit values of a FEC block; and a LDPC decoder coupled to the input. The LDPC decoder performs a failed decode operation on the raw bit values of the FEC block and outputs a syndrome of the failed decode operation and a failed-decode-output-block.

The decode circuit includes a trap detection comparator coupled to the LDPC decoder, and a trap controller coupled to the input of the LDPC decoder and the trap detection comparator. The trap detection comparator determines whether the FEC block is a trapped block by comparing the number of failing check nodes indicated by the syndrome to an error threshold. The FEC block is determined to be a trapped block when the number of failing check nodes indicated by the syndrome is less than the error threshold. When the FEC block is determined to be a trapped block the trap controller performs trapped-block-decoding iterations using the LDPC decoder until the decoding operation is successful or until a predetermined number of trapped-block-decoding iterations have been performed. At each trapped-block-decoding iteration the trap controller generates an updated log likelihood ratio (LLR) map; and provides to the LDPC decoder the updated LLR map and either the raw bit values of the FEC block or a failed-decode-output-block from a previous failed decode operation; and sends an indication to the LDPC decoder to perform a decode operation. In response to the indication, the LDPC decoder uses the updated LLR map to perform a decode operation on the respective bits of the raw bit values of the FEC block or the failed-decode-output-block from the previous failed decode operation. When the FEC block is not determined to be a trapped block the decode circuit outputs an error indication at an output of the decode circuit. When the decoding operation is successful so as to generate a codeword, the decode circuit outputs the codeword.

A memory controller is disclosed that has a decode circuit that includes an input to receive raw bit values of a FEC block; a block buffer memory coupled to the input to store the received raw bit values of the FEC block; a LDPC decoder coupled to the block buffer memory. The LDPC decoder is to perform a failed decode operation on the raw bit values of the FEC block and output a syndrome of the failed decode operation and a failed-decode-output-block. The decode circuit includes a trap detection comparator coupled to the LDPC decoder, and a trap controller coupled to the block buffer memory. The trap detection comparator determines whether the FEC block is a trapped block by comparing the number of failing check nodes indicated by the syndrome to an error threshold, the FEC block determined to be a trapped block when the number of failing check nodes indicated by the syndrome is less than the error threshold. When the FEC block is determined to be a trapped block the trap controller performs trapped-block-decoding iterations using the LDPC decoder until the decoding operation is successful or until a predetermined number of trapped-block-decoding iterations have been performed. At each trapped-block-decoding iteration the trap controller generates an updated LLR map; and provides to the LDPC decoder the updated LLR map and either the raw bit values of the FEC block or a failed-decode-output-block from a previous failed decode operation; and sends an indication to the LDPC decoder to perform a decode operation. In response to the indication, the LDPC decoder uses the updated LLR map to perform a decode operation on the respective bits of the raw bit values of the FEC block or the failed-decode-output-block from the previous failed decode operation. When the FEC block is not determined to be a trapped block the memory controller outputs an error message. When the decoding operation is successful so as to generate a codeword, the memory controller outputs the codeword.

A solid-state drive (SSD) is disclosed that includes a plurality of flash memory devices and a memory controller coupled to the plurality of flash memory devices. The memory controller has a decode circuit that includes an input to receive raw bit values of a FEC block; a block buffer memory coupled to the input to store the received raw bit values of the FEC block; and a LDPC decoder coupled to the block buffer memory. The LDPC decoder performs a failed decode operation on the raw bit values of the FEC block and outputs a syndrome of the failed decode operation and a failed-decode-output-block. The decode circuit includes a trap detection comparator coupled to the LDPC decoder, and a trap controller coupled to the block buffer memory. The trap detection comparator determines whether the FEC block is a trapped block by comparing the number of failing check nodes indicated by the syndrome to an error threshold. The FEC block is determined to be a trapped block when the number of failing check nodes indicated by the syndrome is less than the error threshold. When the FEC block is determined to be a trapped block the trap controller performs trapped-block-decoding iterations using the LDPC decoder until the decoding operation is successful or until a predetermined number of trapped-block-decoding iterations have been performed. At each trapped-block-decoding iteration the trap controller generates an updated LLR map; and provides to the LDPC decoder the updated LLR map and either the raw bit values of the FEC block or a failed-decode-output-block from a previous failed decode operation; and sends an indication to the LDPC decoder to perform a decode operation. In response to the indication, the LDPC decoder uses the updated LLR map to perform a decode operation on the respective bits of the raw bit values of the FEC block or the failed-decode-output-block from the previous failed decode operation. When the FEC block is not determined to be a trapped block the memory controller outputs an error message. When the decoding operation is successful so as to generate a codeword, the memory controller outputs the codeword.

A method for decoding is disclosed that includes: performing a first failed decode operation on raw bit values of a FEC block by a LDPC decoder that outputs a syndrome of the failed decode operation and a failed-decode-output-block. The method includes determining whether the FEC block is a trapped block by comparing the number of failing check nodes indicated by the syndrome to an error threshold, the FEC block determined to be a trapped block when the number of failing check nodes indicated by the syndrome is less than the error threshold. When the FEC block is not determined to be a trapped block an error indication is output. When the FEC block is determined to be a trapped block the method includes: generating an updated LLR map; providing to the LDPC decoder the updated LLR map and either the raw bit values of the FEC block or a failed-decode-output-block from a previous failed decode operation on the trapped block; performing a decode operation of the LDPC decoder using the updated LLR map on the bit values of the FEC block or the failed-decode-output-block from the previous failed decode operation on the trapped block; and repeating the generating, the providing and the performing until the decode operation is successful or until a predetermined number of trapped-block-decoding iterations have been performed. When the decode operation is successful in decoding the FEC block the codeword is output. When the decode operation is not successful in decoding the FEC block and the predetermined number of trapped-block-decoding iterations have been performed, an error indication is output.

The method and apparatus of the present invention reduces the number of errors resulting from trapping sets so as to extend the performance curve below the conventional error floor for the particular LDPC decoding process.

BRIEF DESCRIPTION OF THE DRAWINGS

The accompanying drawings are included to provide a further understanding of the invention, and are incorporated in, and constitute a part of, this specification. The drawings illustrate various examples. The drawings referred to in this brief description are not drawn to scale.

DETAILED DESCRIPTION

Figure 1:
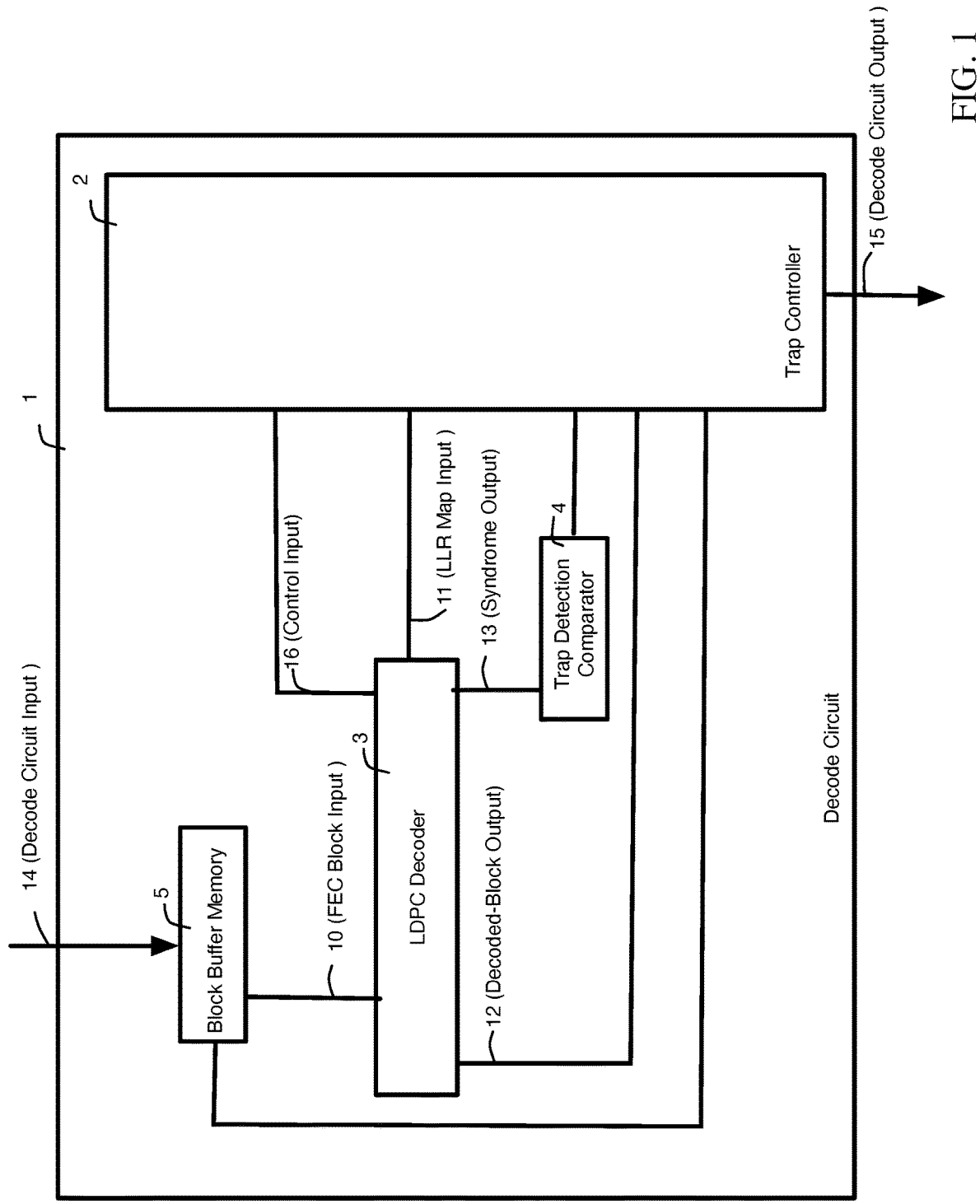
FIG. 1 is a diagram illustrating an example of a decode circuit that includes a block buffer memory.

FIG. 1 shows a decode circuit 1 that includes a block buffer memory 5, an LDPC decoder 3 coupled to block buffer memory 5, a trap detection comparator 4 coupled to LDPC decoder 3 and a trap controller 2. Trap controller 2 is coupled to block buffer memory 5, LDPC decoder 3 and trap detection comparator 4. Decode circuit 1 includes an input 14, that can be referred to hereinafter as "decode circuit input" 14 that couples to block buffer memory 5 and trap controller 2. LDPC decoder 3 includes an input 10 to receive an FEC block, from block buffer memory 5, that can be referred to hereinafter as "FEC block input" 10, an input 11 to receive an LLR map, from trap controller 2, that can be referred to hereinafter as "LLR map input" 11 and an input 16 that can be referred to as "control input" 16 coupled to an output of trap controller 2. The term "LLR map," as used in the present application, is a table or other listing that indicates LLR values that are to be used in a particular LDPC decode operation. In this example, LDPC decoder 3 includes an output 12 for output of a decoded block to trap controller 2, that can be referred to hereinafter as a "decoded-block output" 12, and an output 13 for output of a syndrome to trap detection comparator 4, that can be referred to hereinafter as a "syndrome output" 13. The syndrome for a FEC block that fails to decode in LDPC decoder 3 indicates the number of failing check nodes for the particular decode operation. Though two inputs 11, 16 are shown to couple LDPC decoder 3 to trap controller 2, it is appreciated that, alternatively, a single input could be used to couple LDPC decoder 3 to trap controller 2. Trap controller 2 has an output 15 that forms an output of the decode circuit, that can be referred to as "decode circuit output" 15.

In one example decode circuit 1 is implemented as an integrated circuit (IC) device that is formed on one or more semiconductor die that may be an Application Specific Integrated Circuit (ASIC) or a Programmable Logic Device (PLD) such as a Field Programmable Gate Array (FPGA), without limitation. In the example shown in FIG. 1 decode circuit 1 is shown as having a single input 14 and a single output 15 for illustration purposes. However, in other examples decode circuit 1 includes a plurality of inputs 14 and a plurality of outputs 15, that may be coupled to trap controller 2, or coupled to other components of decode circuit 1.

Figure 2:
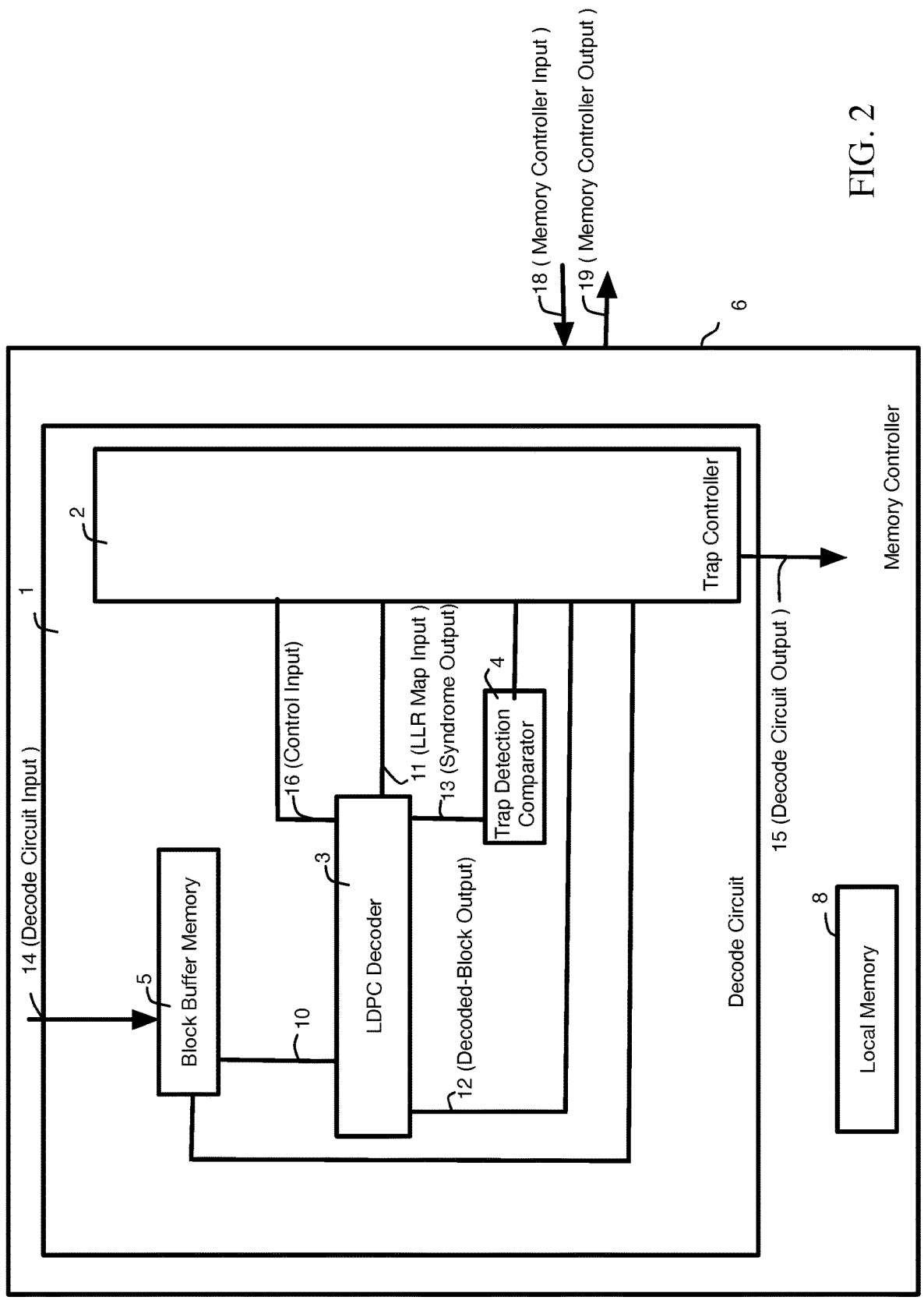
FIG. 2 is a diagram showing an example of a memory controller that includes the decode circuit shown in FIG. 1.

In an example that is illustrated in FIG. 2, decode circuit 1 is implemented in a memory controller 6. In one example memory controller 6 is implemented as an IC device that is formed on a single semiconductor die that may be an ASIC or a PLD such as a FPGA, without limitation. Memory controller 6 includes local memory 8. In one example local memory 8 is registers or Static Random-Access Memory (SRAM) blocks that can be individually accessed by one or more of trap controller 2, LDPC decoder 3, trap detection comparator 4 or other circuits of memory controller 6 or decode circuit 1. Though local memory 8 is illustrated as being in memory controller 6, portions of local memory 8, may be located within one or more of trap controller 2, LDPC decoder 3, trap detection comparator 4, and decode circuit 1, and may include registers or SRAM blocks that are accessible to respective ones of trap controller 2, LDPC decoder 3, trap detection comparator 4, and decode circuit 1. In the example shown in FIG. 2 memory controller 6 is shown as having one or more input 18 (memory controller input), and one or more output 19 (memory controller output). The one or more inputs 18 and outputs 19 are coupled through circuitry of memory controller 6 to the respective input(s) 14 and output(s) 15 of decode circuit 1.

Figure 3:
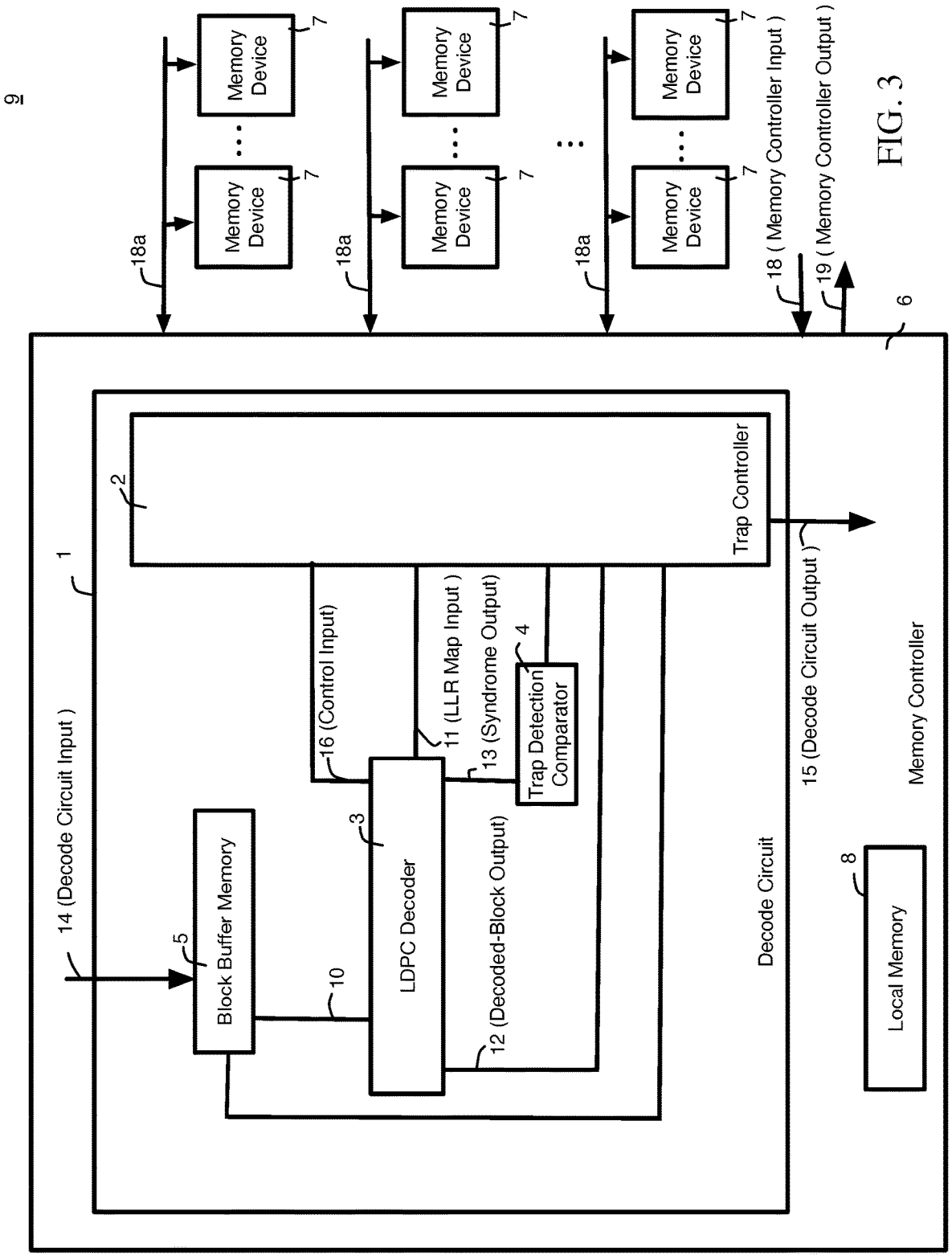
FIG. 3 is a diagram showing an example of an SSD that includes the decode circuit shown in FIG. 1.

FIG. 3 shows an example in which decode circuit 1 is implemented in Solid-State Drive (SSD) 9. SSD 9 includes memory controller 6 that is coupled to a plurality of memory devices 7. Each memory device 7 is a packaged semiconductor die or "chip" that is coupled to memory controller 6 by conductive pathways 18a that couple instructions, data and other information between each flash memory device 7 and memory controller 6. In one example memory devices 7 are flash NOT AND (NAND) memory devices that are implemented as individually packaged IC devices or IC devices packaged in multi-chip modules. In one example, each flash memory device 7 includes NAND memory cells that are organized into blocks and pages, with each block composed of NAND strings that share the same group of wordlines. Memory devices 7 may be single level cell (SLC), multi-level cell (MLC), triple level cell (TLC), quad level cell (QLC) or penta level cell (PLC) devices, without limitation. Memory devices 7 may be any type of memory storage device.

In the following discussion, the operation and the various components of decode circuit 1 are discussed in the context of memory controller 6 of SSD 9 of FIG. 3. However, it is appreciated that decode circuit 1, can be implemented as a stand-alone device as is illustrated in FIG. 1 or in a memory controller 6 that is a stand-alone device as is illustrated in FIG. 2.

Memory controller 6 receives read and write instructions from a host computer and performs program operations, erase operations and read operations on memory cells of memory devices 7 to complete the instructions from the host computer. For example, upon receiving a write instruction from a host computer that includes data to be stored, memory controller 6 generates a codeword that includes the received data and encodes the codeword into a FEC block that is sent to one or more of memory devices 7 along with a corresponding program instruction. Memory devices 7 perform the requested program instruction and store the FEC block by programming memory cells of the respective memory device 7 (e.g., as a logical page). Memory controller 6 may also erase cells of memory devices 7. Upon receiving a read instruction from the host computer, memory controller 6 sends a read instruction to one or more of memory devices 7 and in response, the one or more memory devices 7 perform the read and couple the result of the read in the form of raw bit values of a FEC block to memory controller 6. In response to receiving the raw bit values of the FEC block, memory controller 6 couples the raw bit values of the FEC block to decode circuit 1 for decoding.

In one example some or all of trap controller 2, LDPC decoder 3, trap detection comparator 4, block buffer memory 5 and controller 6 include circuits that are dedicated circuits for performing operations. In another example some or all of trap controller 2, LDPC decoder 3, trap detection comparator 4, block buffer memory 5 and controller 6 include firmware that includes instructions that are performed on one or more processor, with the instructions stored in registers of one or more of memory controller 6, trap controller 2, LDPC decoder 3, trap detection comparator 4 and/or stored in local memory 8. In one example some of all of memory controller 6, trap controller 2, LDPC decoder 3 and trap detection comparator 4 include a processor (not shown) for performing instructions and one or more firmware image is loaded into memory controller 6 prior to operation of memory controller 6, the firmware image including instructions to be performed by one or more of memory controller 6, trap controller 2, LDPC decoder 3 and trap detection comparator 4.

Though examples of the present invention are described as "firmware" it is appreciated that embodiments of the present invention may or may not include firmware. In one example, one or more software programs are used for performing some or all of the method blocks and functions described in the present application. In one specific example, one or more software stack is stored in decode circuit 1 and/or memory controller 6 that is operable on one or more processor to perform some or all of the various functions and method blocks described in the present application.

In one example a read operation is performed in which controller 6 reads one or more memory devices 7 and receives in response raw bit values of a FEC block that are coupled to decode circuit input 14. The raw bit values of a FEC block received at decode circuit input 14 are coupled to block buffer memory 5. Block buffer memory 5 stores the received raw bit values of a FEC block. Block buffer memory 5 can be registers or SRAM blocks that can be individually accessed by LDPC decoder 3, without limitation.

The raw bit values of the FEC block are coupled to LDPC decoder 3 at FEC block input 10. LDPC decoder 3 performs a decode operation on the raw bit values of the FEC block and outputs a syndrome at syndrome output 13 and generates output at decoded block output 12. When the decode is successful the output at decoded-block output 12 is the stored codeword. When the decode is not successful (i.e., a failed decode operation), the output at decoded-block output 12 is a failed-decode-output-block. The term "failed-decode-output-block," as used herein is an output from a LDPC decoder from a failed decode operation. The term "failed decode" as used in the present application is a decode operation on a FEC block that is not successful in identifying the stored codeword corresponding to the FEC block (e.g., a decode operation that does not result in a syndrome of 0).

When LDPC decoder 3 performs a failed decode operation on the raw bit values of the FEC block, LDPC decoder 3 outputs a syndrome of the failed decode operation at syndrome output 13 and a failed-decode-output-block at decoded-block output 12.

When the FEC block is not determined to be a trapped block an error indication is output at decode circuit output 15 of FIGS. 1-3 that can be, for example, an error flag. In response to the error indication, memory controller 6 outputs an error message at memory controller output 19. In one example decode circuit output 15 is coupled to memory controller output 19 and the error indication output at decode circuit output 15 is coupled to, and output at, memory controller output 19. In response to the error message the host computer can then perform a RAID process to recover the codeword or a recovery process can be performed by memory controller 6 in which additional reads and soft decodes are performed.

Figure 4:
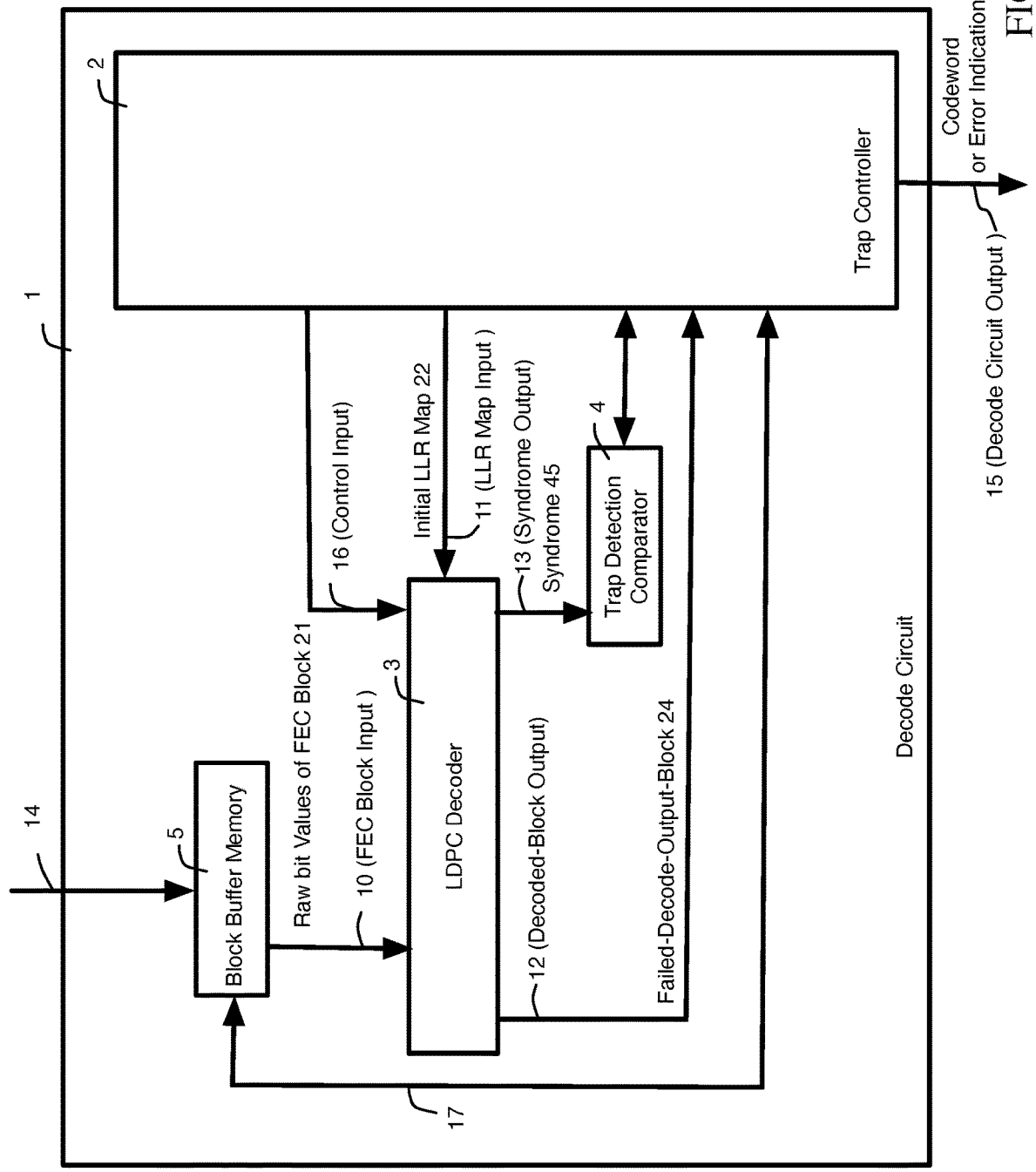
FIG. 4 is a diagram illustrating an example of a first failed decode.

FIG. 4 illustrates a failed decode operation, that may be referred to hereinafter as a "first failed decode operation." The term "first failed decode operation," as used in the present application refers to the first time that a particular FEC block fails to successfully decode when the particular FEC block is determined to be a trapped block (e.g., a particular FEC block that a decode operation was performed on, where the output of the decode operation indicated that the particular block was a trapped block). In the example shown in FIG. 4, raw bit values of a FEC block 21 are received at FEC block input 10, from block buffer memory 5, an LLR map 22 (that may be referred to as an "initial LLR map") is generated by trap controller 2 and coupled to LDPC decoder 3 via LLR map input 11. The term "LLR map," as used in the present application, is an indication of a plurality of LLR values, and may be in the form of one or more words or a sequence of ones and zeroes that indicate respective ones of the plurality of LLR values. In this example LDPC decoder 3 fails to decode the FEC block corresponding to raw bit values of FEC block 21, whereupon LDPC decoder 3 generates failed-decode-output-block 24 at decoded-block output 12 and a syndrome 45 at syndrome output 13. In one example the first failed decode operation is a soft decode operation in which initial LLR map 22 is used (e.g., a 3-bit soft decode operation in which input for each bit position includes a 1 or a 0 and a LLR value). Alternatively, the first failed decode operation can be a hard decode operation. When the first failed decode is a hard decode no initial LLR map is generated or provided to LDPC decoder 3.

Trap detection comparator 4 determines whether the FEC block is a trapped block by comparing the number of failing check nodes indicated by the syndrome to an error threshold. The FEC block is determined to be a trapped block when the number of failing check nodes indicated by the syndrome is less than the error threshold. In one example, the error threshold is coupled from trap controller 2 to trap detection comparator 4. Alternatively, the error threshold is stored in local memory 8 that is accessible to trap detection comparator 4 or stored in a portion of local memory 8 within trap detection comparator 4. In one example the error threshold is received at input 14, 18, allowing a user of memory controller 6 to set the error threshold at a desired value. Alternatively, a default error threshold is set by trap controller 2.

In the example shown in FIG. 4, syndrome 45 has a value less than the error threshold and therefore FEC block 21 is a trapped block. When the FEC block is determined to be a trapped block decode circuit 1 performs iterations using the LDPC decoder 3 until the decoding operation is successful or until a predetermined number of decoding iterations have been performed. These iterations are referred to hereinafter as "trapped-block" decoding iterations. The term "trapped-block-decoding iteration," as used in the present application, is an iteration that is performed to decode a FEC block that has been determined to be a trapped block. At each trapped-block-decoding iteration the trap controller 2 generates an updated LLR map; provides to the LDPC decoder the updated LLR map and either the raw bit values of the FEC block or a failed-decode-output-block from a previous failed decode operation, and sends an indication to LDPC decoder 3 to perform a decode operation. In response to the indication, LDPC decoder 3 uses the updated LLR map to perform a decode operation on the respective bits of the raw bit values of the FEC block or the failed-decode-output-block from the previous failed decode operation. When the maximum number of trapped-block-decoding iterations are reached and LDPC decoder 3 has failed to successfully decode the FEC block, an error indication is output at decode circuit output 15 of FIGS. 1-3 that can be, for example, an error flag. In response to the error indication, memory controller 6 outputs an error message at memory controller output 19. In response to the error message the host computer can then perform a RAID process to recover the codeword.

When the decoding operation is successful so as to generate a codeword, the decode circuit 1 outputs the codeword at decode circuit output 15. In response to the output of the codeword at decode circuit output 15, memory controller 6 outputs the codeword at memory controller output 19.

Figure 5:
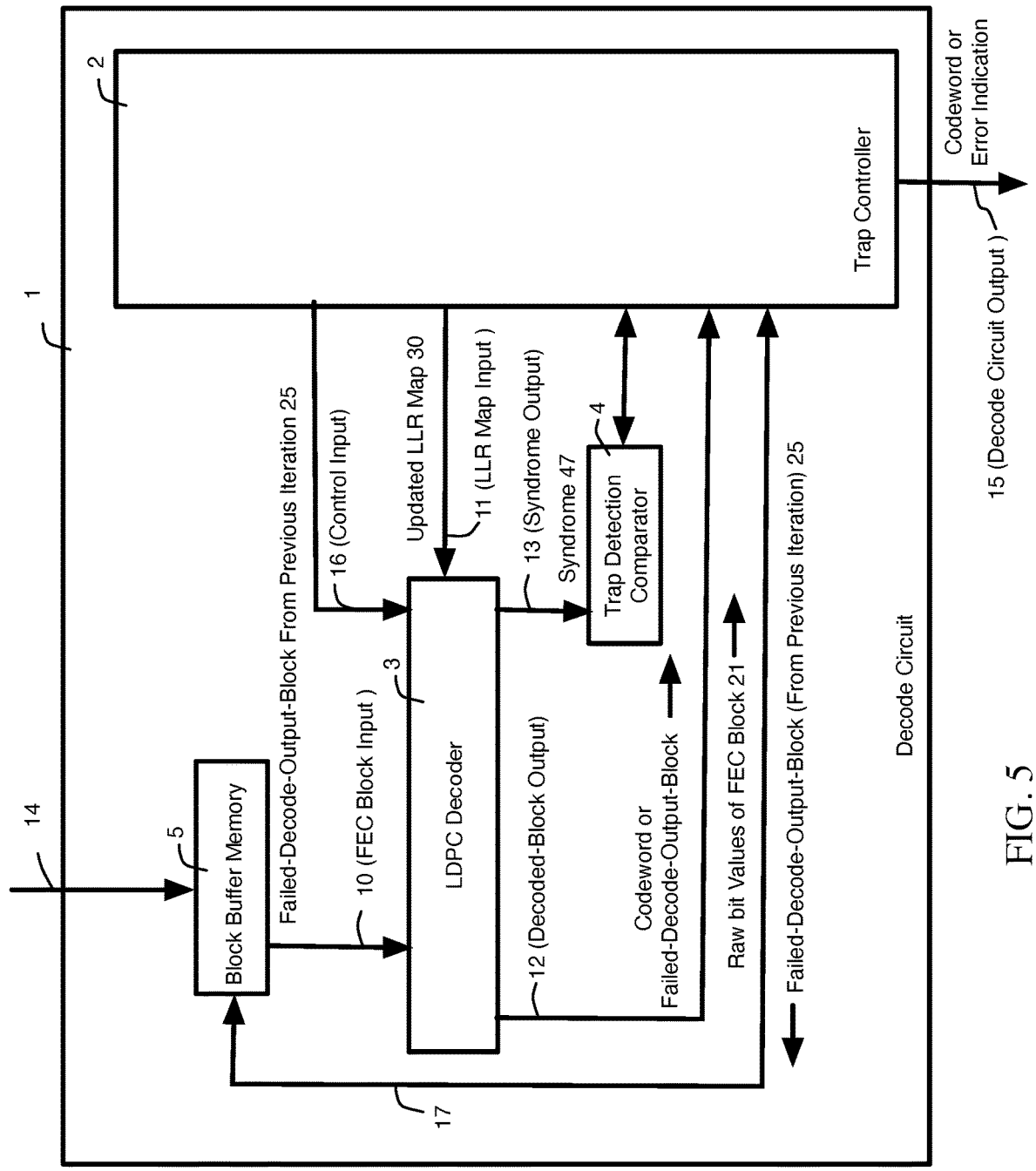
FIG. 5 is a diagram showing an example of a trapped-block-decoding iteration in which a decode operation is performed on a failed-decode-output-block from a previous iteration.

FIG. 5 illustrates an example of a trapped-block-decoding iteration. The term "trapped-block-decoding iteration," as used herein refers to a decode iteration on a block that has been determined to be a trapped block. At each trapped-block-decoding iteration, trap controller 2 generates an updated LLR map. In the example shown in FIG. 5, raw bit values of FEC link 21 are coupled to trap controller 2 over link 17 that couples trap controller 2 to block buffer memory 5 and trap controller 2 uses the received raw bit values of FEC link 21 to generate updated LLR map 30 (that may also be referred to as the "first updated LLR map"). Trap controller 2 provides to the LDPC decoder 3 updated LLR map 30 and the failed-decode-output-block from a previous failed decode operation 25; and sends an indication to the LDPC controller 3 to perform a decode operation via control input 16. In the present example, trap controller 2 couples the failed-decode-block from a previous failed decode operation 25 to LDPC controller 5 by storing failed-decode-output-block from a previous failed decode operation 25 in block buffer memory 5 (e.g., overwriting the previously stored raw bit values of FEC link 21). In response to each indication, LDPC decoder 3 uses the updated LLR map 30 to perform a decode operation on the failed-decode-output-block from a previous failed decode operation 25. In the first trapped-block-decoding iteration the failed-decode-output-block from the previous failed decode operation 25 will be failed-decode-output-block 24 from FIG. 4. In the event that the decode is successful, the resulting codeword is output at 12 and trap controller 2 outputs the codeword at decode circuit output 15. When the LDPC decode is not successful, the iterative process continues until the decoding operation is successful or until a predetermined number of trapped-block-decoding iterations have been performed.

In one example, all trapped-block-decoding iterations are performed using the failed-decode-output-block from a previous failed decode operation 25. However, alternatively, one or more trapped-block-decoding-iteration can be performed on the raw bit values of FEC block 21.

Figure 6:
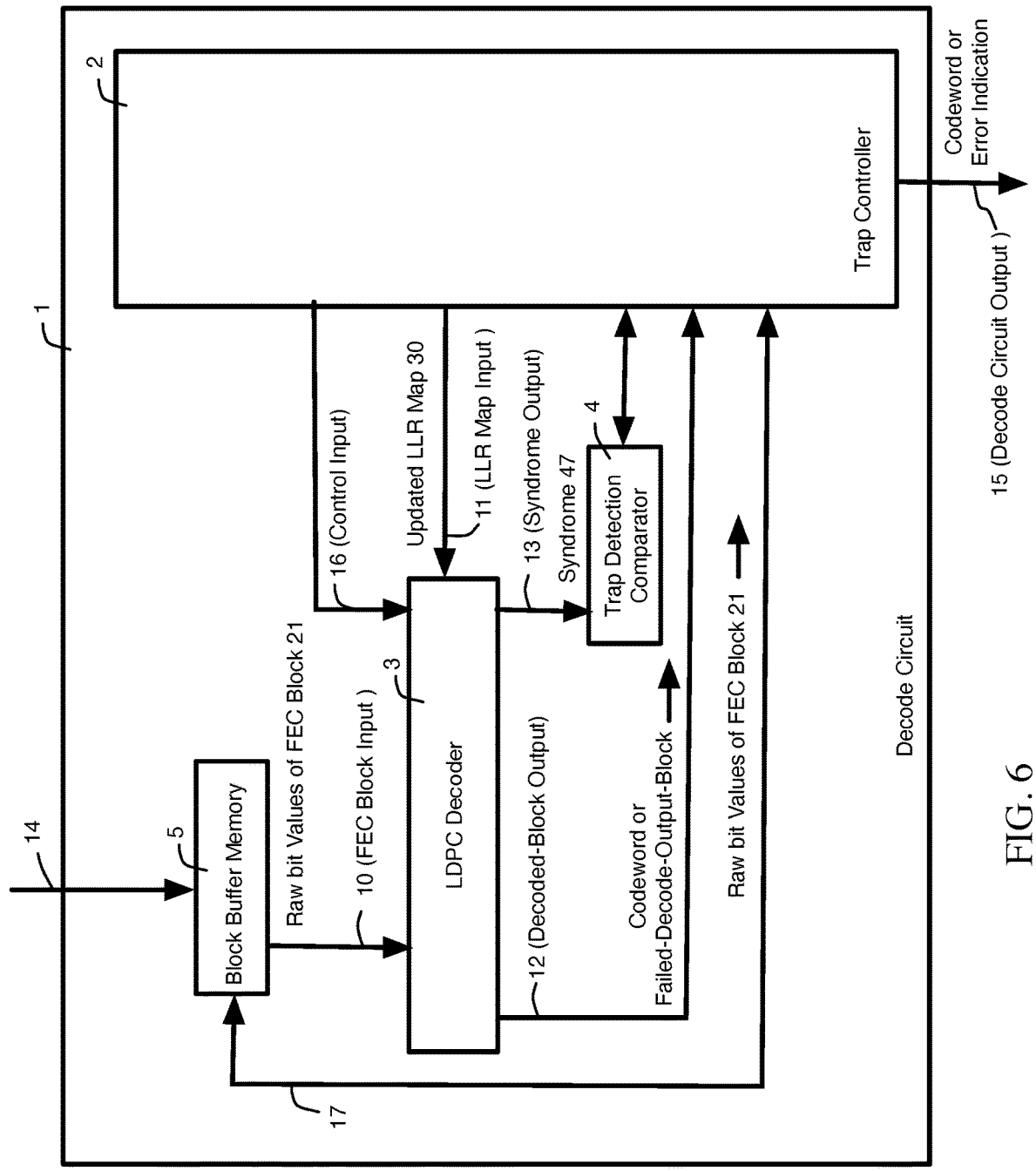
FIG. 6 is a diagram showing an example of a trapped-block-decoding iteration in which a decode operation is performed on raw bit values of a FEC block.

FIG. 6 shows an example of a trapped-block-decoding-iteration in which the decode operation is performed on the raw bit values of FEC block 21. In this example, the raw bit values of FEC block 21 that were stored in block buffer memory 5 in the example of FIG. 4 are not changed, and are again used to perform a decode operation. In this example updated LLR map 30 and the raw bit values of the FEC block 21 that were stored in block buffer memory 5 are coupled to LDPC decoder 3. Trap controller 2 sends an indication to the LDPC controller 3 (e.g., via control input 16) to perform a decode operation. In response to the indication, LDPC decoder 3 uses first updated LLR map 30 to perform the decode operation on the raw bit values of the FEC block 21. In the event that the decode of FIG. 6 is successful the resulting codeword is output at 12 and trap controller 2 outputs the codeword at decode circuit output 15. In one example, all trapped-block-decoding iterations are performed using the raw bit values of FEC block 21. In another example, one or more trapped-block-decoding iterations are performed using the raw bit values of FEC block 21, and then one or more trapped-block-decoding iterations are performed using the failed-decode-output-block from a previous failed decode operation 25.

Figure 7:
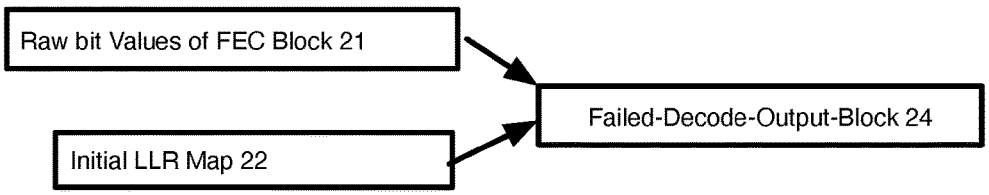
FIG. 7 is a diagram illustrating an example of a first failed decode and N trapped-block-decoding iterations.
Figure 7:
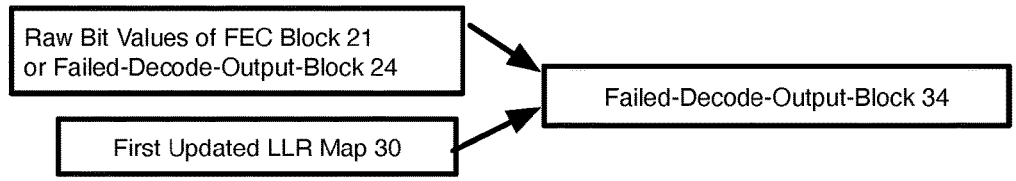
Figure 7:
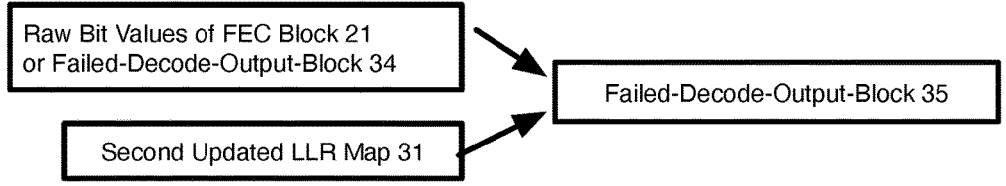
Figure 7:
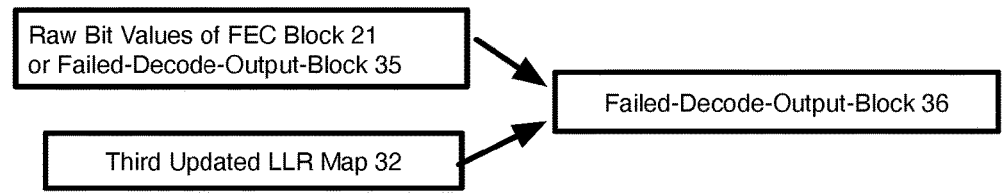
Figure 7:
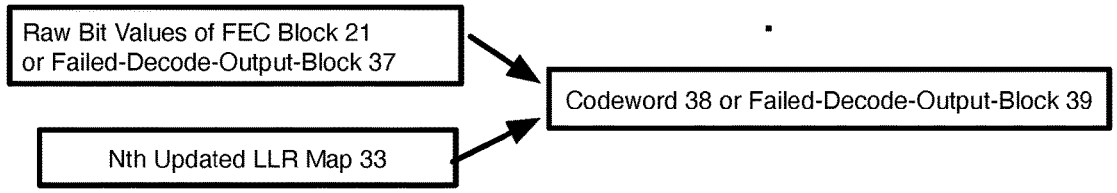

FIG. 7 illustrates an example in which there are N trapped-block-decoding iterations. In this example, in the first failed decode 20a, raw bit values of FEC block 21 and initial LLR map 22 are input to LDPC controller 3; and LDPC controller 3 performs a decoding operation on raw bit values of FEC block 21 using initial LLR map 22 to output failed-decode-output-block 24 at decoded block output 12. In a first trapped-block-decoding iteration 40a trap controller 2 generates a first updated LLR map 30 and couples first updated LLR map 30 and either failed-decode-output-block 24 or raw bit values of FEC block 21 to LDPC controller 3. LDPC controller 3 then performs a decode operation on failed-decode-output-block 24 or raw bit values of FEC block 21 using first updated LLR map 30. In this example, the decode process is not successful such that a failed-decode-output-block 34 is produced at decoded-block output 12. In a second trapped-block-decoding iteration 40b trap controller 2 generates a second updated LLR map 31 and couples second updated LLR map 31 and either failed-decode-output-block 34 or raw bit values of FEC block 21 to LDPC controller 3. LDPC controller 3 then performs a decode operation on failed-decode-output-block 34 or raw bit values of FEC block 21 using second updated LLR map 31. In this example, the decode operation is not successful such that a failed-decode-output-block 35 is produced at decoded-block output 12. In a third trapped-block-decoding iteration 40c trap controller 2 generates a third updated LLR map 32 and couples third updated LLR map 32 and either failed-decode-output-block 35 or raw bit values of FEC block 21 to LDPC controller 3. LDPC controller 3 then performs a decode operation on failed-decode-output-block 35 or raw bit values of FEC block 21 using third updated LLR map 32. In this example, the decode process is not successful such that a failed-decode-output-block 36 is output at decoded-block output 12.

The process continues until a decode operation is successful or until a predetermined number (e.g., "N") trapped-block decoding iterations have been performed. In the present example, "N" iterations are performed and in the $N^{th}$ iteration $N^{th}$ updated LLR map 33 and either raw bit values of FEC block 21 or failed-decode-output-block 37 from the previous failed decode iteration are used in the decoding operation. If the LDPC decoding operation is successful a codeword 38 is output at decoded-block output 12. If the $N^{th}$ decode operation is not successful failed-decode-output-block 39 is output at decoded-block output 12 and an error message is output from decode circuit 1.

In one example, trap controller 2 includes a counter that counts the number of trapped-block-decoding iterations in which LDPC controller 3 fails to decode the FEC block that was determined to be a trapped block. Trap controller 2 compares the value in the counter to the maximum number of iterations, and determines that the maximum number of iterations has been reached when the counter is equal to the maximum number of iterations. In one example the counter in trap controller 2 is cleared when a decoding operation of LDPC decoder 3 is successful. In one example the counter is cleared when it is determined by trap detection comparator 4 that the FEC block is a trapped block.

In one example N is equal to a number of different LLR maps generated by trap controller 2, and trap controller 2 continues performing iterations until the codeword has been identified or all LLR maps have been tried.

The LLR values in updated LLR maps 30-32 may be generated in any of a number of different ways, and can be a function of corresponding raw bit values in raw bit values of FEC block 21. FIGS. 8A-8D show examples for generating updated LLR maps 30-33. In the example illustrated in FIG. 8A trap controller 2 uses weak bit values corresponding to each bit in the FEC block (41) and stochastic probability values corresponding to each bit in the FEC block (42) to generate the updated LLR map (43). In one example an H-matrix in the decode performed by LDPC decoder 3 is analyzed to identify corresponding bits that are considered to be weak bits. Bits that are not identified as weak bits are referred to hereinafter as "sturdy" bits. Weak bits are bits that exhibit poor decoding performance and may be identified by performing testing (e.g., in a test lab) to identify bit positions in the H-matrix that are more likely to be in error in LDPC decode operations that use the particular H-matrix. In one example the testing includes encoding codewords using the particular H-matrix, storing the codewords on memory devices and decoding the stored codewords using the H-matrix, and identifying bit positions having the highest number of bit errors.

Figure 8A:
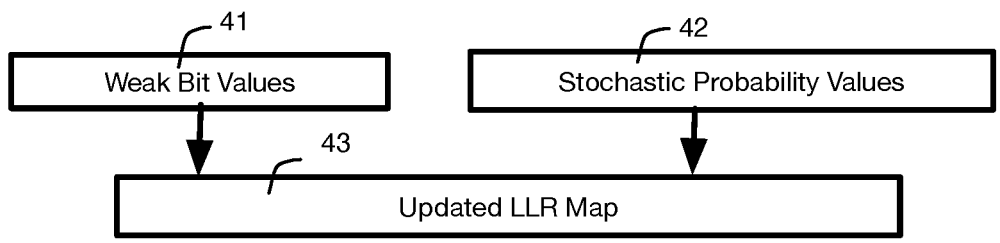
FIG. 8A is a diagram illustrating an example in which weak bit values and stochastic probability values are used to generate an updated LLR map.
Figure 8B:
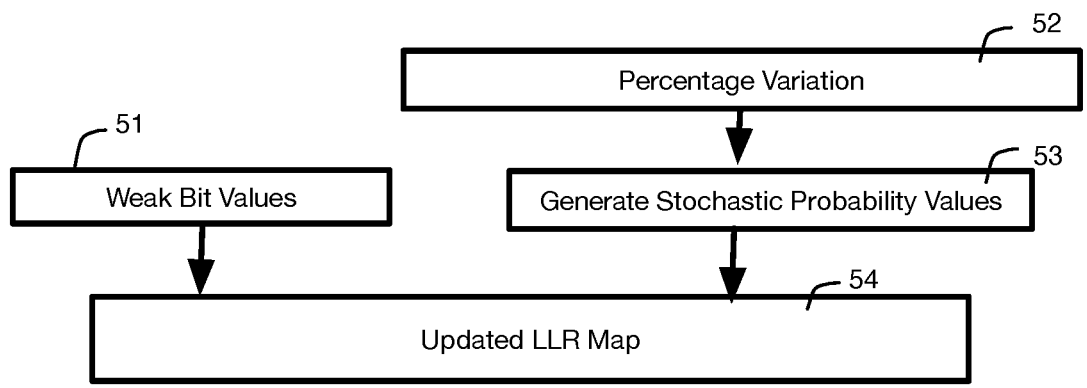
FIG. 8B is a diagram illustrating an example in which weak bit values and stochastic probability values are used to generate an updated LLR map, and in which percentage variation is used to generate the stochastic probability values.

In an example shown in FIG. 8B the trap controller applies (52) a percentage variation to individual ones of the raw bit values of the FEC bits to generate (53) the stochastic probability values. In this example weak bit values (51) and generated stochastic probability values (53) are used to generate the updated LLR map (54). Referring back to FIG. 5, in one example trap controller 2 reads the raw bit values of FEC block 21 from block buffer memory 5 and generates stochastic probability values by changing one or more of the bit values of raw bit values of FEC block 21 to a different bit value to generate the stochastic probability value. In one example some or all of the raw bit values of FEC block 21 are changed in a manner corresponding to the percentage variation 52 such that the stochastic probability values exhibit the percentage variation 52. In one example, the stochastic probability value is generated by changing the sign of a respective LLR (e.g., positive to negative or negative to positive), resulting in randomly flipping a zero to a one or a one to a zero.

Figures 8C, 8D:
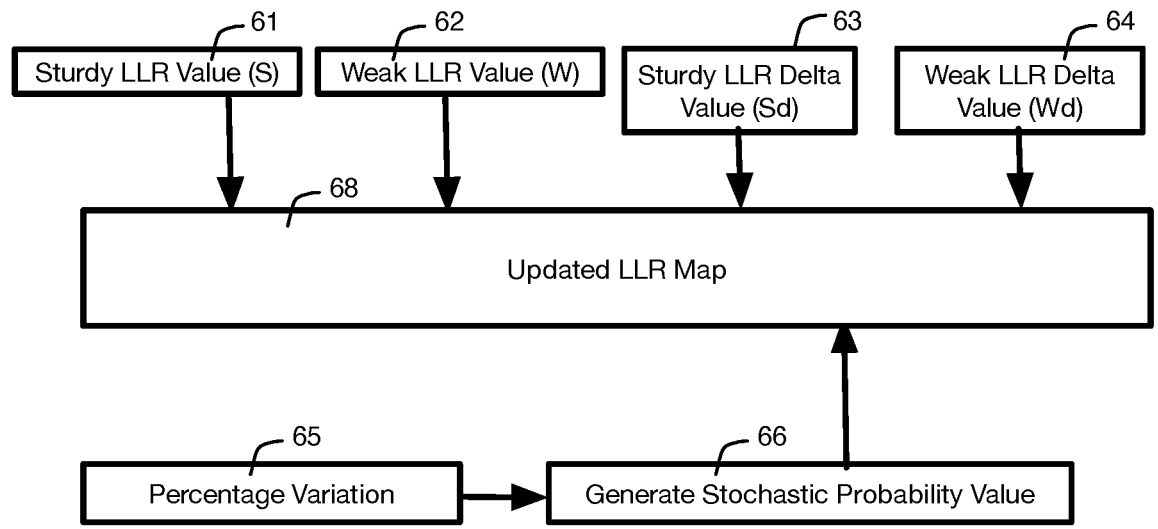
FIG. 8C is a diagram illustrating an example in which weak bit values and stochastic probability values are used to generate an updated LLR map, and in which percentage variation is used to generate the stochastic probability values.
FIG. 8D is a diagram illustrating a table that indicates an example of generating an updated LLR.

In an example shown in FIG. 8C stochastic probability values are generated (66) using percentage variation (65) and the weak bit values include a weak LLR value (W) at 62 and a weak LLR delta value (Wd) at 64. In this example, the trap controller uses a sturdy LLR value (S) at 61, W at 62, a sturdy LLR delta value (Sd) at 63, Wd at 64 and generated stochastic probability values (66) to generate the updated LLR map 68. The term "sturdy" is used in the present application simply to indicate an LLR value relating to a bit position that does not correspond to a weak bit (i.e., corresponding to a sturdy bit), and the term is not intended to have any other connotations. In one example weak bit values are determined by identifying weak columns in the H-matrix. In this example each LLR value in the updated LLR map that corresponds to a weak column of the H-matrix has a LLR value that is equal to W, and each LLR value in the updated LLR map that corresponds to a column of the H-matrix that is not a weak column has a LLR value that is equal to S.

In one example S are conventional LLR values that would normally be used to decode a particular bit position and W are values that are for decoding a particular bit position when that bit position is determined to correspond to a weak bit in the H matrix. In one example the conventional input values are each half of the maximum input LLR value ($LLR_{MAX}$), e.g. $LLR_{MAX}/2$. Sd are values that are different from the corresponding traditional LLR values that would normally be used to decode a particular bit position and may be a function of the corresponding S for a particular bit position (e.g., Sd=½*S). Wd are values that are different from the corresponding W value and may be a function of the corresponding W for a particular bit position (e.g., Wd=½*W). In one example each S is set to a first predetermined value and each W is set to a second predetermined value that is different from the first predetermined value. Alternatively, each S and W in the raw bit values of FEC block 21 can be set to a different value. In another example S for a particular bit position is equal to the LLR value of that particular bit position in initial LLR map 22, W for each bit position is a function of the LLR value of that particular bit position in in initial LLR map 22, Sd for each bit position is a function of the corresponding S for that particular bit position, and Wd for each bit position is a function of the corresponding W for that particular bit position.

FIG. 8D illustrates a function that can be used to generate an LLR map where raw bit values are indicated in a first column 71, stochastic bit values are indicated in a second column 72, weak bit values 73 are indicated in third column 73 and the function used to determine LLR for that particular bit position is indicated in column 74. In this example weak bits are given a weak bit value of 1 and bits that are not weak bits are given a weak bit value of 0. As indicated by row 70a, when a particular bit position has a raw bit value of "0", a stochastic bit value of "0" and is not a weak bit (has a weak bit value of "0") the input LLR for that bit position is positive S. As indicated by row 70b, when a particular bit position has a raw bit value of "0", a stochastic bit value of "0" and is a weak bit (has a weak bit value of "1") the input LLR for that bit position is positive W. As indicated by row 70c, when a particular bit position has a raw bit value of "0", a stochastic bit value of "1" and is not a weak bit (has a weak bit value of "0") the input LLR for that bit position is positive (S+Sd). As indicated by row 70d, when a particular bit position has a raw bit value of "0", a stochastic bit value of "1" and is a weak bit (has a weak bit value of "1") the input LLR for that bit position is positive (W+Wd). As indicated by row 70e, when a particular bit position has a raw bit value of "1", a stochastic bit value of "0" and is not a weak bit (has a weak bit value of "0") the input LLR for that bit position is negative S. As indicated by row 70f, when a particular bit position has a raw bit value of "1", a stochastic bit value of "0" and is a weak bit (has a weak bit value of "1") the input LLR for that bit position is negative W. As indicated by row 70g, when a particular bit position has a raw bit value of "1", a stochastic bit value of "1" and is not a weak bit (has a weak bit value of "0") the input LLR for that bit position is negative (S+Sd). As indicated by row 70h, when a particular bit position has a raw bit value of "1", a stochastic bit value of "1" and is a weak bit (has a weak bit value of "1") the input LLR for that bit position is negative (W+Wd). In one example S=8, W=4, SD=2 and Wd=1 such that the strong inputs are twice the weak inputs. In another example S=8, W=2, Sd=0, Wd=2. In yet another example S values are 8 and weak values are randomly either 4 or 0. In one example illustrated in FIG. 8E, a user input is received indicating weak bit values at 81 (e.g., received at input 14 and/or 18), and in this example the user input includes S at 61, W at 62, Sd at 63 and WD at 64. User input indicating a percentage variation is received at 82 (e.g., received at input 14 and/or 18) and trap controller 2 applies the percentage variation to individual ones of the raw bit values of the FEC bits to generate at 66 a stochastic probability value corresponding to each bit in the FEC block.

Figure 8E:
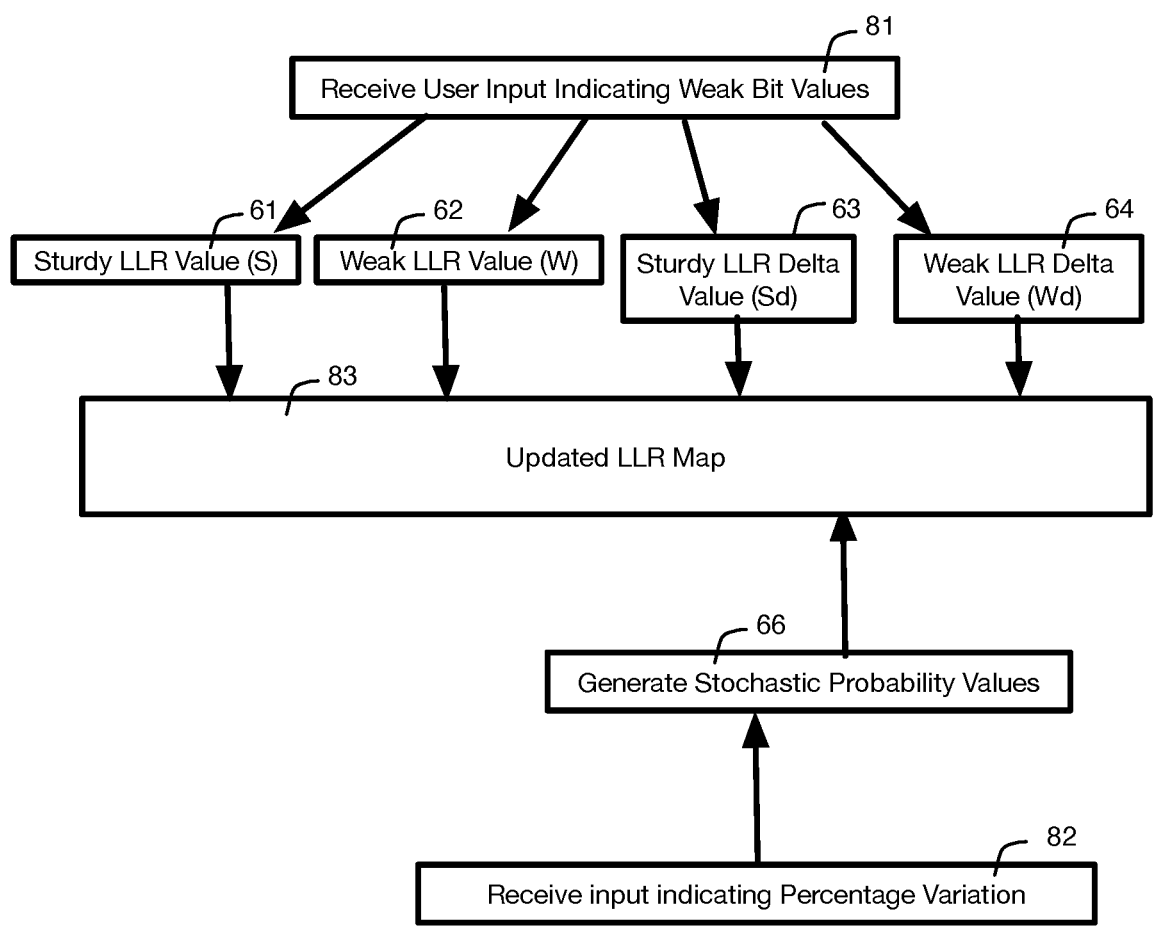
FIG. 8E is a diagram illustrating an example in which updated LLR values are generated using input received at the decode circuit and/or the memory controller.

Trap controller 2 uses the generate stochastic probability values, S, W, Sd and Wd to generate the updated LLR map at 83. In one example, user input is provided by a manufacturer of SSD by uploading the user input at input 18 prior to sending SSD 9 to a customer. In addition to receiving input indicating weak bit values and input indicating percentage variation as shown in FIG. 8E, input can be received (e.g., at input 14 and/or 18) indicating the error threshold, so as to allow the manufacturer of SSD 9 to vary weak bit values, percentage variation and error threshold so as to meet the needs of a particular customer or group of customers.

In one example all positive values of the LLR map represent 0's and all negative values of the LLR map represent 1's. Magnitudes represent confidence. In one example a magnitude of 0 indicates that a low amount of confidence (i.e., no confidence as to whether the particular bit is a 1 or a 0) and the amount of confidence increases as the magnitude approaches 15. In this example an LLR of 2 is a very weak 0, an LLR of 4 is a weak 0, and an LLR of 15 is a strong 0. Similarly, an LLR of 12 is a very weak 1, an LLR of −4 is a weak 1, and an LLR of −15 is a strong 1.

Subsequent updated LLR maps 31-33 can be generated in the same manner as first updated LLR map 30. Alternatively, one of more of the following factors may be varied in generating subsequent updated LLR maps 31-33 as compared to first updated LLR map 30: S, Sd, W, Wd and percentage variation 52.

In one example subsequent updated LLR maps 31-33 are different from each other as a result of changing one or more of the stochastic probability values S, W, Sd and Wd. In one example updated LLR maps 31-33 are generated in the same manner as updated LLR map 30 except that one or more of S, W, Sd and Wd are changed, or a function is performed on one or more of S, W, Sd and Wd to vary the outcome.

In another example, each updated LLR map is a function of the bit values in the failed-decode-output-block from a previous iteration 25. In one example each trapped-block-decoding iteration is performed in the same manner as illustrated in FIG. 8D, using the failed-decode output block from a previous iteration 25 at FEC block input 10 and using an updated LLR map that is generated in the same manner as subsequent updated LLR map 30 except that, instead of using raw bit values of FEC block 21 in column 71 of FIG. 8D, the bit values from the failed-decode-output block from a previous iteration 25 are used in the computation. In this example, in the first trapped-block-decoding iteration illustrated in FIG. 7, the function illustrated in FIG. 8D is applied to the respective bit values in the failed-decode-output-block 24 to generate the LLR values in first updated LLR map 30. In the second trapped-block-decoding iteration 40b the function illustrated in FIG. 8D is applied to the respective bit values in the failed-decode-output-block 34 to generate the LLR values in second updated LLR map 31. In third trapped-block-decoding iteration 40c the function illustrated in FIG. 8D is applied to the respective bit values in the failed-decode-output-block 35 to generate the LLR values in third updated LLR map 32.

In one example both the first failed decode operation and trapped-block decoding iterations are a soft decode with three different bits of information (raw, strong/weak and stochastic) incorporated into each LLR value in the LLR map, with 8 values corresponding to each input bit. In one example both initial LLR map 22 and updated LLR maps 30-33 include LLR values that can be any of eight different values, 4 different is (each having one of 4 different confidence levels) and 4 different 0s (each having one of 4 different confidence levels). In one example 3-bit soft decoding is used in which each individual LLR map 22 and 30-33 indicates a single LLR value corresponding to each raw bit position that is a single signed value corresponding to the particular raw bit position.

In one example the number of trapped-block-decoding iterations is equal to the number of updated LLR maps generated by trap controller 2, with each trapped-block-decoding iteration using a different LLR map until all LLR maps have been tried. In one example 8 different LLR maps are generated by trap controller 2 and each trapped-block-decode-iteration uses a different one of the eight LLR maps, with trapped-block-decoding iterations continuing until the decoding operation successfully identifies the codeword or all of the eight different LLR maps have been tried.

In the example shown in FIG. 4 the first failed decode was described as a hard decode operation or a soft decode operation (e.g., a 3-bit soft decode). However, alternatively the first failed decode operation generates the initial LLR map in a manner illustrated in one or more of FIGS. 8A-8E. In one such example, the first failed decode is a soft decode with three different bits of information raw, strong/weak and stochastic, with 8 different possible values corresponding to each input bit (4 different 1's with 4 different confidence levels and 4 different 0's with 4 different confidence levels).

Figure 9A:
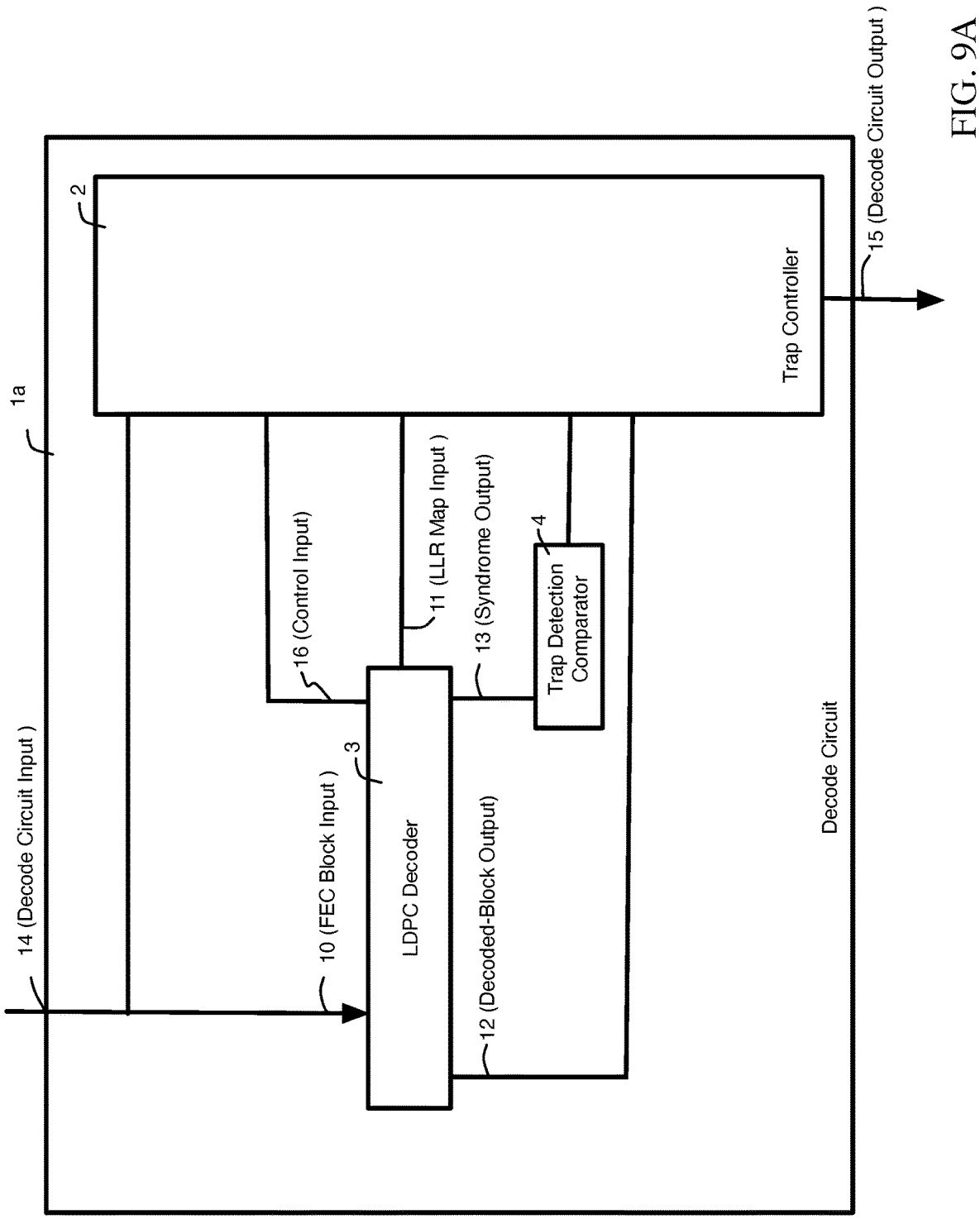
FIG. 9A illustrates an example of a decode circuit that does not include a block buffer memory 5.
Figure 9B:
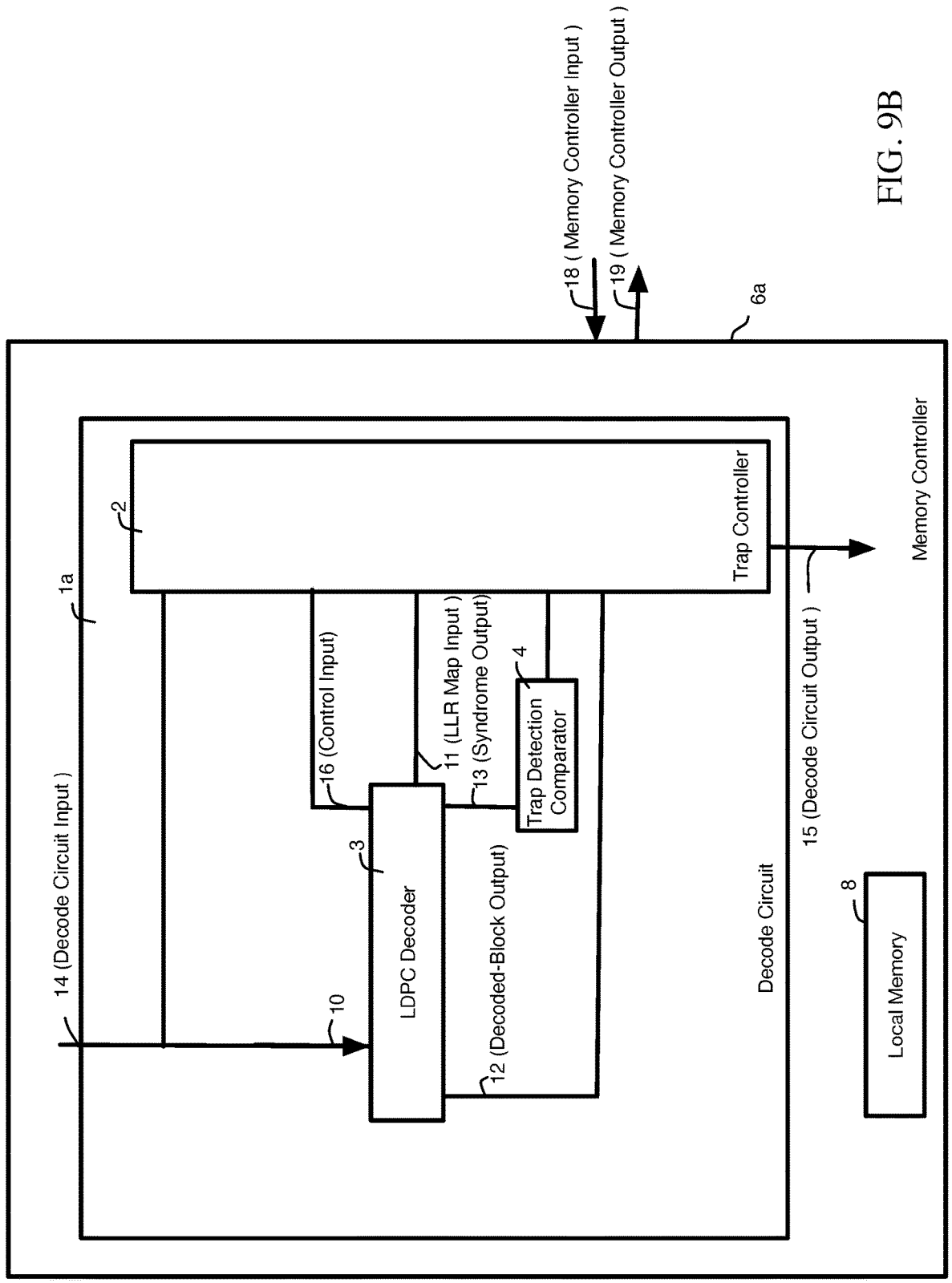
FIG. 9B is a diagram showing an example of a memory controller that includes the decode circuit shown in FIG. 9A.
Figure 9C:
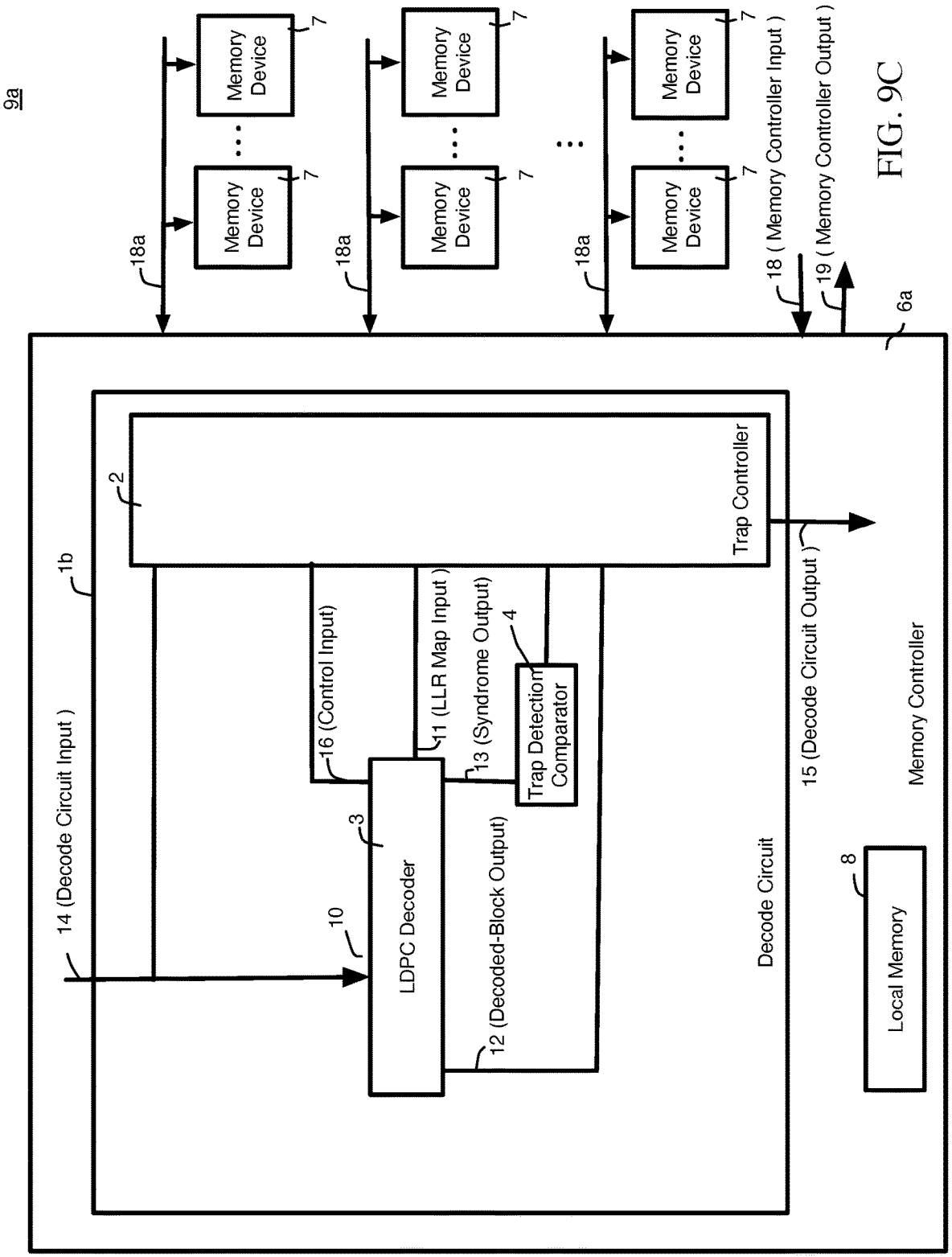
FIG. 9C is a diagram showing an example of an SSD that includes the decode circuit shown in FIG. 9A.

FIG. 9A illustrates an example of a decode circuit 1a that does not include a block buffer memory 5. In this example, decode circuit input 14 is coupled directly to FEC block input 10 and to trap controller 2. Decode circuit 1a operates in the same manner as decode circuit 1 discussed in FIGS. 1-8 except as indicated below. FIG. 9B illustrates an example of a memory controller 6a having a decode circuit 1a that does not include a block buffer memory 5. Memory controller 6a operates in the same manner as memory controller 6 discussed in FIGS. 1-8 except as indicated below. FIG. 9C illustrates an example of a SSD 9a having memory controller 6a and a decode circuit 1a that does not include a block buffer memory 5. SSD 9a operates in the same manner as SSD 9 discussed in FIGS. 1-8 except as indicated below. In the examples of FIGS. 9A-9C FEC blocks received at decode circuit input 14 are coupled directly from decode circuit input 14 to FEC block input 10 of LDPC decoder 3. In one example trap controller 2 is operable to store raw bit values of FEC block 21 and failed-decode-output-blocks as needed to generate updated LLR maps and to couple either raw bit values of FEC block 21 or failed-decode-output-blocks to LDPC decoder 3.

Figure 10:
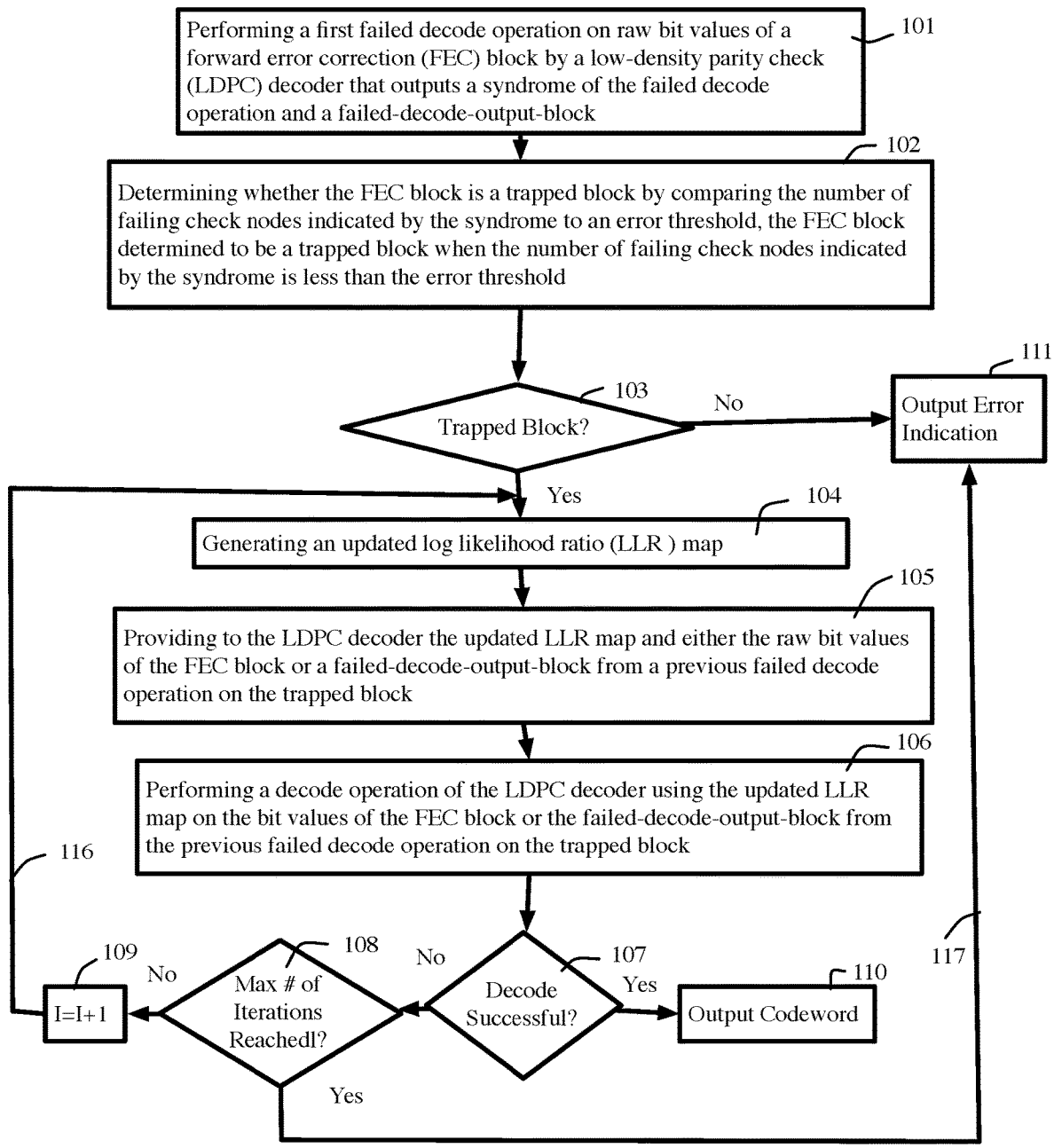
FIG. 10 is a diagram illustrating a method for decoding in which trapped blocks are identified and actions are performed to attempt to decode the trapped blocks.

FIG. 10 illustrates a method (100) for decoding that includes performing (101) a first failed decode operation on raw bit values of a forward error correction (FEC) block by a low-density parity check (LDPC) decoder that outputs a syndrome of the failed decode operation and a failed-decode-output-block. The method includes determining (102) whether the FEC block is a trapped block by comparing the number of failing check nodes indicated by the syndrome to an error threshold. The FEC block is determined to be a trapped block when the number of failing check nodes indicated by the syndrome is less than the error threshold. When the decode fails (101) and the FEC block is not determined to be a trapped block (103) an error indication is output (111). When the FEC block is determined to be a trapped block the method includes performing trapped-block-decoding iterations (104-109, 116). Each of the trapped-block-decoding iterations includes: generating (104) an updated LLR map, providing (105) to the LDPC decoder the updated LLR map and either the raw bit values of the FEC block or a failed-decode-output-block from a previous failed decode operation on the trapped block, performing (106) a decode operation of the LDPC decoder using the updated LLR map on the bit values of the FEC block or the failed-decode-output-block from the previous failed decode operation on the trapped block. The trapped-block-decoding iterations of blocks 104-106 are performed until the decode operation is successful (107, 110) or until a predetermined number of trapped-block-decoding iterations have been performed (107-108, 117). After each trapped-block-decoding iteration a counter of trap controller 2 is incremented (I=I+1) (109) and the counter is used for determining in block 108 whether the maximum number of iterations have been reached. When the decode operation is successful (107) in decoding the FEC block the codeword is output (110). When the decode operation is not successful in decoding the FEC block and the predetermined number of trapped-block-decoding iterations have been performed (107-108, 117), an error indication is output (111) via path 117.

In one example, the error indication (111) is output at decode circuit output 15 of FIGS. 1-3 and in response to the error indication memory controller 6, 6a outputs an error message. The host computer can then perform a RAID process to recover the codeword.

Figure 11:
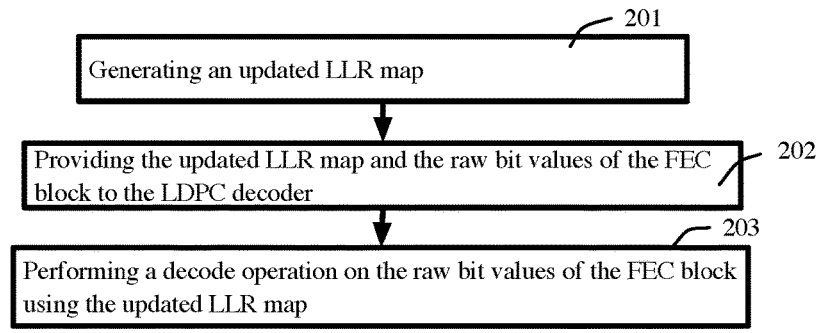
FIG. 11 is a diagram illustrating an example of a first trapped-block-decoding iteration in the method of FIG. 10 in which decoding is performed on raw bit values of the FEC block.

The decoding iteration of steps 104-106 can be performed using raw bit values of the FEC block or using a failed-decode-output-block from the previous failed decode operation on the trapped block. FIG. 11 illustrates an example in which decoding is performed on raw bit values of the FEC block. In this example, the trapped-block-decoding iteration includes: generating (201) an updated LLR map, providing to the LDPC decoder (202) the updated LLR map and the raw bit values of the FEC block, and performing (203) a decode operation on the raw bit values of the FEC block using the updated LLR map.

Figure 12:
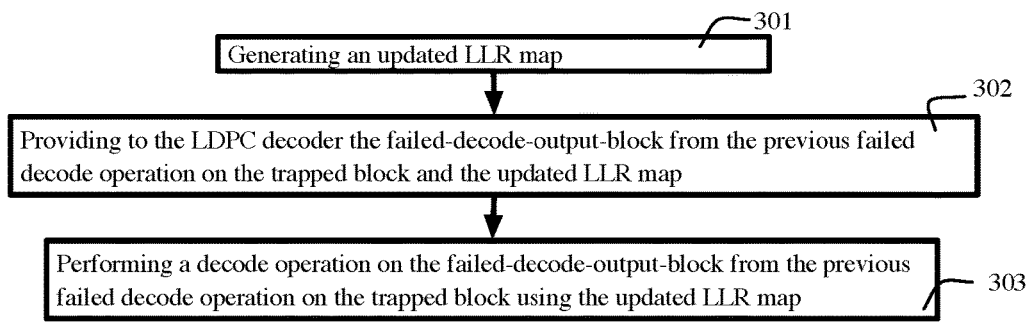
FIG. 12 is a diagram illustrating an example of a trapped-block-decoding iteration in the method of FIG. 10 in which decoding is performed on a failed-decode-output-block from the previous failed decode operation on the trapped block.

FIG. 12 shows an example in which the decoding iteration of steps 104-106 are performed using a failed-decode-output-block from the previous failed decode operation on the trapped block. In this example, the trapped-block-decoding iteration includes: generating (301) a updated LLR map; providing (302) to the LDPC decoder the failed-decode-output-block from a previous failed decode operation on the trapped block and the updated LLR map, and performing (303) a decode operation on the failed-decode-output-block from the previous failed decode operation on the trapped block using the updated LLR map.

Figure 13:
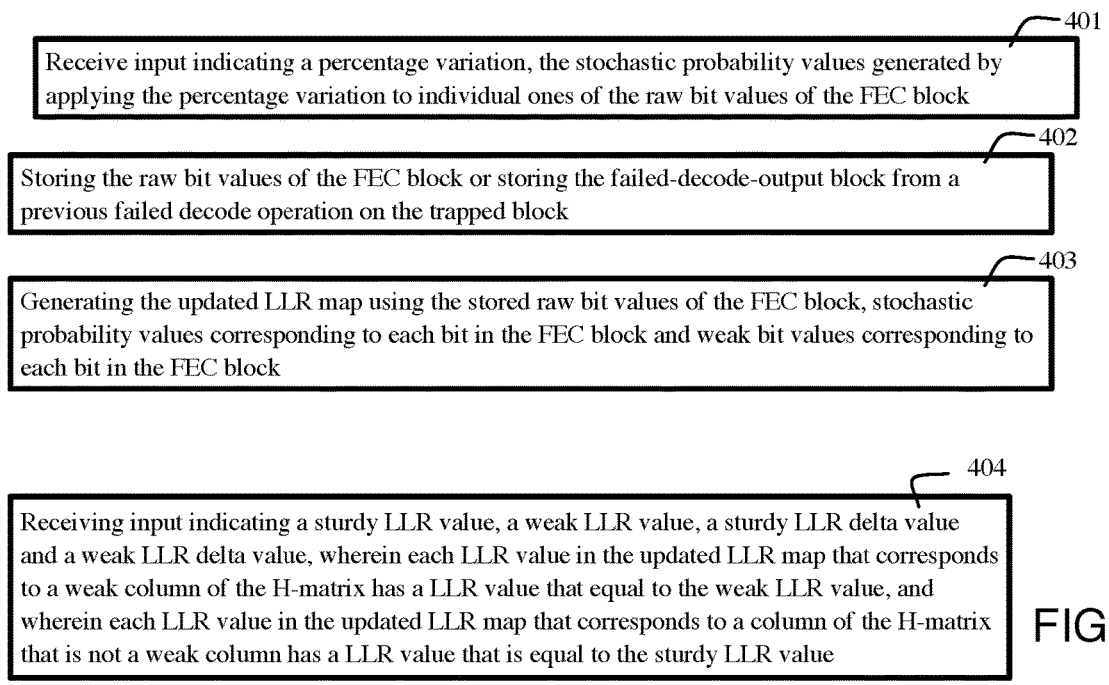
FIG. 13 is a diagram illustrating blocks that can be performed in addition to those shown in the method of FIG. 10.

FIG. 13 shows examples of additional blocks that could be included in method 100. As shown by block 401, method 100 includes receiving input indicating a percentage variation, and the stochastic probability values are generated by applying the percentage variation to individual ones of the raw bit values of the FEC block.

As shown by block 402 method 100 includes storing the raw bit values of the FEC block or storing the failed-decode-output block from a previous failed decode operation on the trapped block. As shown by block 403 method 100 includes generating the updated LLR map using the stored raw bit values of the FEC block, stochastic probability values corresponding to each bit in the FEC block and weak bit values corresponding to each bit in the FEC block.

As shown by block 404 method 100 includes receiving input indicating S, W, Sd and Wd, wherein each LLR value in the updated LLR map that corresponds to a weak column of the H-matrix has a LLR value that is equal to W, and wherein each LLR value in the updated LLR map that corresponds to a column of the H-matrix that is not a weak column has a LLR value that is equal to S.

Figure 14:
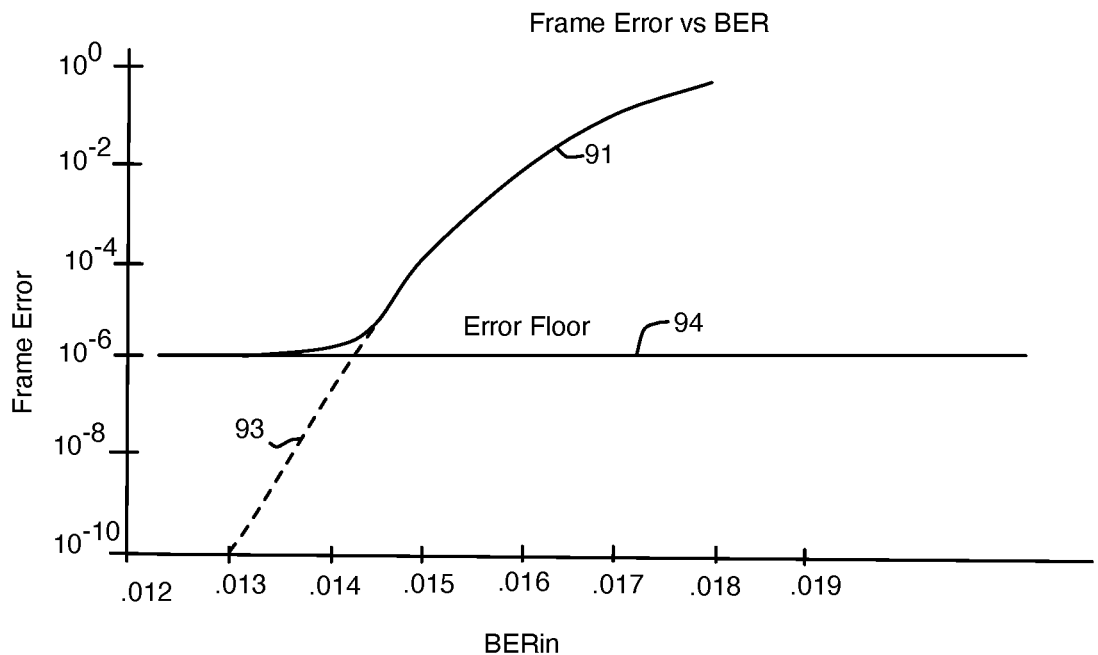
FIG. 14 is a diagram illustrating frame error on the vertical axis and bit error rate on the horizontal axis that shows a performance curve and a waterfall for a conventional LDPC decoder.

FIG. 14 shows a diagram that illustrates frame error on the vertical axis and bit error rate (BER) on the horizontal axis. The diagram illustrates waterfall 93 and a performance curve 91 for a conventional LDPC decoding process. It can be seen that performance curve 91 diverges laterally as it approaches error floor 94. The top of waterfall 93 is not visible as it extends along performance curve 91, with only that portion of waterfall 93 visible that extends below where performance curve 91 diverges from waterfall 92.

Figure 15:
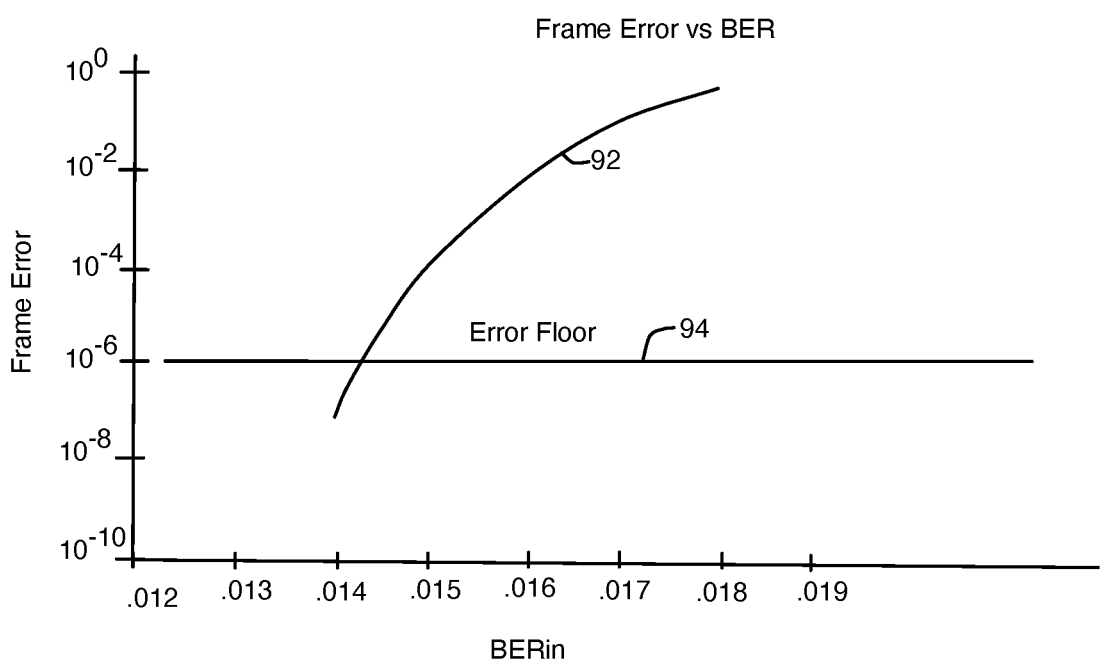
FIG. 15 is a diagram illustrating frame error on the vertical axis and bit error rate on the horizontal axis that shows a performance curve for an example of the method and apparatus shown in FIGS. 1-13.

FIG. 15 shows a diagram that illustrates frame error on the vertical axis and bit error rate (BER) on the horizontal axis. The diagram illustrates a performance curve 92 in accordance with an example of the method and apparatus shown in FIGS. 1-13. It can be seen that performance curve 92 extends below error floor 94 for the conventional LDPC decoding process illustrated in FIG. 14.

It is appreciated that FIGS. 1-13 are examples, and that many other examples are possible, including use of known methods for decoding trapped sets in conjunction with the methods and apparatus disclosed in the present application. In one example one are more known conventional methods for decoding trapped sets is also used in the decoding of a trapped block. For example, a conventional decoding iteration can be added after the first failed decode 20a shown in FIG. 8, and prior to first trapped-block decoding iteration 20b in which a LLR map is used for the decode that includes a predetermined set of LLR values, each of which are set to a predetermined low LLR value. For example, a conventional decoding operation can be added in which the LLR value is set to a predetermined low value.

In the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

The invention claimed is:

1. A decode circuit comprising:
   an input to receive raw bit values of a forward error correction (FEC) block;
   a low-density parity check (LDPC) decoder coupled to the input, the LDPC controller to perform a failed decode operation on the raw bit values of the FEC block and output a syndrome of the failed decode operation and a failed-decode-output-block;
   a trap detection comparator coupled to the LDPC decoder, the trap detection comparator to determine whether the FEC block is a trapped block by comparing the number of failing check nodes indicated by the syndrome to an error threshold, the FEC block determined to be a trapped block when the number of failing check nodes indicated by the syndrome is less than the error threshold; and
   a trap controller coupled to the input, the trap detection comparator and the LDPC decoder, wherein when the FEC block is determined to be a trapped block the trap controller to perform trapped-block-decoding iterations using the LDPC decoder until the decoding operation is successful or until a predetermined number of trapped-block-decoding iterations have been performed, at each trapped-block-decoding iteration the trap controller to:
       generate an updated log likelihood ratio (LLR) map,
       provide to the LDPC decoder the updated LLR map and either the raw bit values of the FEC block or a failed-decode-output-block from a previous failed decode operation, and send an indication to the LDPC decoder to perform a decode operation, and the LDPC decoder, in response to the indication, to use the updated LLR map to perform a decode operation on the respective bits of the raw bit values of the FEC block or the failed-decode-output-block from the previous failed decode operation, wherein when the FEC block is not determined to be a trapped block the decode circuit to output an error indication at an output of the decode circuit, and when the decoding operation is successful so as to generate a codeword, the decode circuit to output the codeword.

2. The decode circuit of claim 1 further comprising a block buffer memory coupled to the input to store the received raw bit values of the FEC block, coupled to the LDPC decoder and coupled to the trap controller, and wherein the either the raw bit values of the FEC block or a failed-decode-output-block from a previous failed decode operation are stored in the block buffer memory during a respective trapped-block-decoding iteration.

3. The decode circuit of claim 2, wherein, in each trapped-block decoding iteration the trap controller is to generate an updated LLR map, store a failed-decode-output-block from a previous failed decode operation in the block buffer memory, provide to the LDPC decoder the updated LLR map and the failed-decode-output-block from the previous failed decode operation, send an indication to the LDPC controller to perform a decode operation, and in response to each subsequent indication, the LDPC decoder to use the updated LLR map to perform a decode operation on the failed-decode-output-block from the previous failed decode operation.

4. The decode circuit of claim 2, wherein trap controller is to use weak bit values corresponding to each bit in the FEC block and stochastic probability values corresponding to each bit in the FEC block to generate the updated LLR map.

5. The decode circuit of claim 4, wherein the weak bit values comprise a weak LLR value and a weak LLR delta value, and wherein the trap controller is to use a sturdy LLR value, the weak LLR value, a sturdy LLR delta value and the weak LLR delta value and the stochastic probability values to generate the updated LLR map.

6. A memory controller comprising:

a decode circuit including:

an input to receive raw bit values of a forward error correction (FEC) block;

a block buffer memory coupled to the input to store the received raw bit values of the FEC block;

a low-density parity check (LDPC) decoder coupled to the block buffer memory, the LDPC controller to perform a failed decode operation on the raw bit values of the FEC block and output a syndrome of the failed decode operation and a failed-decode-output-block;

a trap detection comparator coupled to the LDPC decoder, the trap detection comparator to determine whether the FEC block is a trapped block by comparing the number of failing check nodes indicated by the syndrome to an error threshold, the FEC block determined to be a trapped block when the number of failing check nodes indicated by the syndrome is less than the error threshold; and a trap controller coupled to the block buffer memory, the trap detection comparator and the LDPC decoder, wherein when the FEC block is determined to be a trapped block the trap controller to perform trapped-block-decoding iterations using the LDPC decoder until the decode operation is successful or until a predetermined number of trapped-block-decoding iterations have been performed, at each trapped-block-decoding iteration the trap controller to:

generate an updated log likelihood ratio (LLR) map, provide to the LDPC decoder the updated LLR map and either the raw bit values of the FEC block or a failed-decode-output-block from a previous failed decode operation, and send an indication to the LDPC decoder to perform a decode operation, in response to the indication, the LDPC decoder to use the updated LLR map to perform a decode operation on the respective bits of the raw bit values of the FEC block or the failed-decode-output-block from the previous failed decode operation, when the FEC block is not determined to be a trapped block the memory controller to output an error message, and when the decoding operation is successful so as to generate a codeword, the memory controller to output the codeword.

7. The memory controller of claim 6, wherein the first failed decode operation is a decode operation in which an initial LLR map is used to perform the first failed decode operation, and wherein, in each trapped-block decoding iteration the trap controller is to generate an updated LLR map, store a failed-decode-output-block from a previous failed decode operation in the block buffer memory, provide to the LDPC decoder the updated LLR map and the failed-decode-output-block from the previous failed decode operation, send an indication to the LDPC controller to perform a decode operation, and in response to the indication, the LDPC decoder to use the updated LLR map to perform a decode operation on the failed-decode-output-block from the previous failed decode operation.

8. The memory controller of claim 6, wherein the trap controller is to use weak bit values corresponding to each bit in the FEC block and stochastic probability values corresponding to each bit in the FEC block to generate the updated LLR map.

9. The memory controller of claim 8 wherein the trap controller is to apply a percentage variation to individual ones of the raw bit values of the FEC block to generate the stochastic probability values.

10. The memory controller of claim 9, wherein the weak bit values comprise a weak LLR value and a weak LLR delta value, and wherein the trap controller is to use a sturdy LLR value, the weak LLR value, a sturdy LLR delta value and the weak LLR delta value and the stochastic probability values to generate the updated LLR map.

11. The memory controller of claim 6 comprising an input:

to receive input indicating a percentage variation, wherein the trap controller is to apply the percentage variation to individual ones of the raw bit values of the FEC block to determine the stochastic probability values, wherein the trap controller is to generate a stochastic probability value corresponding to each bit in the FEC block, to receive input indicating a sturdy LLR value, a weak LLR value, a sturdy LLR delta value and a weak LLR delta value, and wherein the trap controller is to use the generated stochastic probability values, the sturdy LLR value, the weak LLR value, the sturdy LLR delta value and the weak LLR delta value to generate the updated LLR map.

12. A solid state drive (SSD) comprising:
a plurality of memory devices;
a memory controller coupled to the plurality of memory devices, the memory controller including a decode circuit, the decode circuit comprising:
  an input to receive raw bit values of a forward error correction (FEC) block from a read of one or more of the plurality of memory devices;
  a block buffer memory coupled to the input to store the received raw bit values of the FEC block;
  a low-density parity check (LDPC) decoder coupled to the block buffer memory, the LDPC controller to perform a failed decode operation on the raw bit values of the FEC block and output a syndrome of the failed decode operation and a failed-decode-output-block;
  a trap detection comparator coupled to the LDPC decoder, the trap detection comparator to determine whether the FEC block is a trapped block by comparing the number of failing check nodes indicated by the syndrome to an error threshold, the FEC block determined to be a trapped block when the number of failing check nodes indicated by the syndrome is less than the error threshold; and
  a trap controller coupled to the block buffer memory, the trap detection comparator and the LDPC decoder, when the FEC block is determined to be a trapped block the trap controller to perform trapped-block-decoding iterations using the LDPC decoder until the decode operation is successful or until a predetermined number of trapped-block-decoding iterations have been performed, at each trapped-block-decoding iteration the trap controller to:
    generate an updated log likelihood ratio (LLR) map,
    provide to the LDPC decoder the updated LLR map and either the raw bit values of the FEC block or a failed-decode-output-block from a previous failed decode operation, and
    send an indication to the LDPC decoder to perform a decode operation,
  in response to the indication, the LDPC decoder to use the updated LLR map to perform a decoding operation on the respective bits of the raw bit values of the FEC block or the failed-decode-output-block from the previous failed decode operation, and
  when the FEC block is not determined to be a trapped block the memory controller to output an error message, and
  when the decoding operation is successful so as to generate a codeword, the memory controller to output the codeword.

13. The SSD of claim 12, wherein the first failed decode operation is a decode operation in which an initial LLR map is used to perform the first failed decode operation, and wherein at each trapped-block-decoding iteration the trap controller is to:

generate the updated LLR map,
store a failed-decode-output-block from a previous failed decode operation in the block buffer memory,
provide to the LDPC decoder the updated LLR map and the failed-decode-output-block from the previous failed decode operation,
send an indication to the LDPC controller to perform a decode operation, and
in response to each indication, the LDPC decoder to use the updated LLR map to perform a decode operation on the failed-decode-output-block from the previous failed decode operation.

14. A method for decoding comprising:
performing a first failed decode operation on raw bit values of a forward error correction (FEC) block by a low-density parity check (LDPC) decoder that outputs a syndrome of the failed decode operation and a failed-decode-output-block;
determining whether the FEC block is a trapped block by comparing the number of failing check nodes indicated by the syndrome to an error threshold, the FEC block determined to be a trapped block when the number of failing check nodes indicated by the syndrome is less than the error threshold;
when the FEC block is not determined to be a trapped block outputting an error indication;
when the FEC block is determined to be a trapped block:
  generating an updated log likelihood ratio (LLR) map;
  providing to the LDPC decoder the updated LLR map and either the raw bit values of the FEC block or a failed-decode-output-block from a previous failed decode operation on the trapped block;
  performing a decode operation of the LDPC decoder using the updated LLR map on the bit values of the FEC block or the failed-decode-output-block from the previous failed decode operation on the trapped block; and
  repeating the generating, the providing and the performing until the decode operation is successful or until a predetermined number of trapped-block-decoding iterations have been performed; and
when the decode operation is successful in decoding the FEC block outputting the codeword; and
when the decode operation is not successful in decoding the FEC block and the predetermined number of trapped-block-decoding iterations have been performed, outputting an error indication.

15. The method of claim 14 wherein the performing trapped-block-decoding iterations comprises:
generating an updated LLR map;
providing to the LDPC decoder the failed-decode-output-block from the previous failed decode operation on the trapped block and the updated LLR map; and
performing a decode operation on the failed-decode-output-block from the previous failed decode operation on the trapped block using the updated LLR map.

16. The method of claim 14 further comprising storing the raw bit values of the FEC block or storing the failed-decode-output block from a previous failed decode operation on the trapped block.

17. The method of claim 14 wherein the updated LLR map is generated using the stored raw bit values of the FEC block, stochastic probability values corresponding to each bit in the FEC block and weak bit values corresponding to each bit in the FEC block.

18. The method of claim 17 comprising receiving input indicating a percentage variation, wherein the stochastic probability values are generated by applying the percentage variation to individual ones of the raw bit values of the FEC block.

19. The method of claim 14 comprising:
receiving input indicating a sturdy LLR value, a weak LLR value, a sturdy LLR delta value and a weak LLR delta value,
wherein each LLR value in the updated LLR map that corresponds to a weak column of the H-matrix has an LLR value that is equal to the weak LLR value, and
wherein each LLR value in the updated LLR map that corresponds to a column of the H-matrix that is not a weak column has a LLR value that is equal to the sturdy LLR value.

* * * * *